United States Patent
Cho et al.

(10) Patent No.: US 8,937,305 B2
(45) Date of Patent: Jan. 20, 2015

(54) SEMICONDUCTOR DEVICE

(71) Applicant: Semiconductor Energy Laboratory Co., Ltd., Atsugi-shi, Kanagawa-ken (JP)

(72) Inventors: Takayuki Cho, Tochigi (JP); Shunsuke Koshioka, Tochigi (JP); Masatoshi Yokoyama, Tochigi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/652,686

(22) Filed: Oct. 16, 2012

(65) Prior Publication Data
US 2013/0099232 A1    Apr. 25, 2013

(30) Foreign Application Priority Data

Oct. 24, 2011  (JP) .................................. 2011-233187
Oct. 24, 2011  (JP) .................................. 2011-233278

(51) Int. Cl.
*H01L 29/786*  (2006.01)
*H01L 29/51*  (2006.01)
(Continued)

(52) U.S. Cl.
CPC .......... *H01L 29/513* (2013.01); *H01L 29/517* (2013.01); *H01L 29/7869* (2013.01); *H01L 29/4908* (2013.01); *H01L 29/66742* (2013.01)
USPC ............. 257/43; 438/151; 438/158; 438/104; 438/48; 438/164

(58) Field of Classification Search
USPC ................ 257/43, E29.296, 66, 72, E21.703
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Chuong A Luu
*Assistant Examiner* — Rodolfo Fortich
(74) *Attorney, Agent, or Firm* — Eric J. Robinson; Robinson Intellectual Property Law Office, P.C.

(57) ABSTRACT

To provide a highly reliable semiconductor device which includes a transistor including an oxide semiconductor, in a semiconductor device including a staggered transistor having a bottom-gate structure provided over a glass substrate, a gate insulating film in which a first gate insulating film and a second gate insulating film, whose compositions are different from each other, are stacked in this order is provided over a gate electrode layer. Alternatively, in a staggered transistor having a bottom-gate structure, a protective insulating film is provided between a glass substrate and a gate electrode layer. A metal element contained in the glass substrate has a concentration lower than or equal to $5\times10^{18}$ atoms/cm$^3$ at the interface between the first gate insulating film and the second gate insulating film or the interface between the gate electrode layer and a gate insulating film.

16 Claims, 17 Drawing Sheets

(51) Int. Cl.
H01L 29/49 (2006.01)
H01L 29/66 (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,058,647 B2 | 11/2011 | Kuwabara et al. |
| 8,338,827 B2 | 12/2012 | Yamazaki et al. |
| 8,502,216 B2 | 8/2013 | Akimoto et al. |
| 8,772,784 B2 | 7/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0047759 A1* | 2/2009 | Yamazaki et al. ............ 438/158 |
| 2009/0068773 A1 | 3/2009 | Lai et al. |
| 2009/0073325 A1 | 3/2009 | Kuwabara et al. |
| 2009/0090916 A1* | 4/2009 | Yamazaki et al. ............ 257/66 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117075 A1* | 5/2010 | Akimoto et al. ............ 257/43 |
| 2012/0064665 A1 | 3/2012 | Yamazaki |
| 2013/0299824 A1 | 11/2013 | Akimoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemitry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15—Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", Am—FPD '08 Digest of Technical Papers, Jul. 2, 2008, pp. 251-252, The Japan Society of Applied Physics.

Jeong.J et al., "3.1: Distinguished Paper: 12.1—Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", Am—FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM—FPD '08 Digest of Technical Papers, Jul. 2, 2008, pp. 275-278.

Park.S et al., "Challenge to Future Displays: Transparent AM—OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM—FPD '09 Digest of Technical Papers, Jul. 1, 2009, pp. 41-44.

Osada.T et al., "Development of Driver-Integrated Panel Using Amorphous In—Ga—Zn—Oxide TFT,", AM—FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM—OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—Bo Systems [A; Fe, Ga, or Al; B: Mg, n, Fe, Ni, Cu,or Zn]at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM—OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

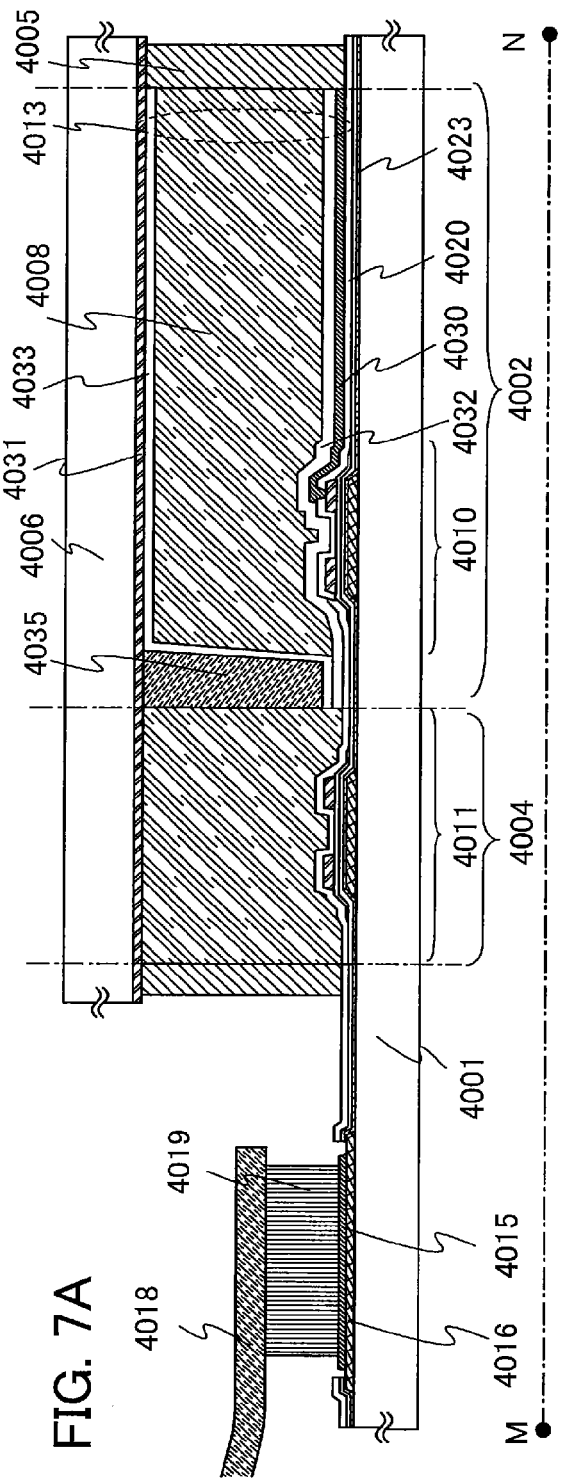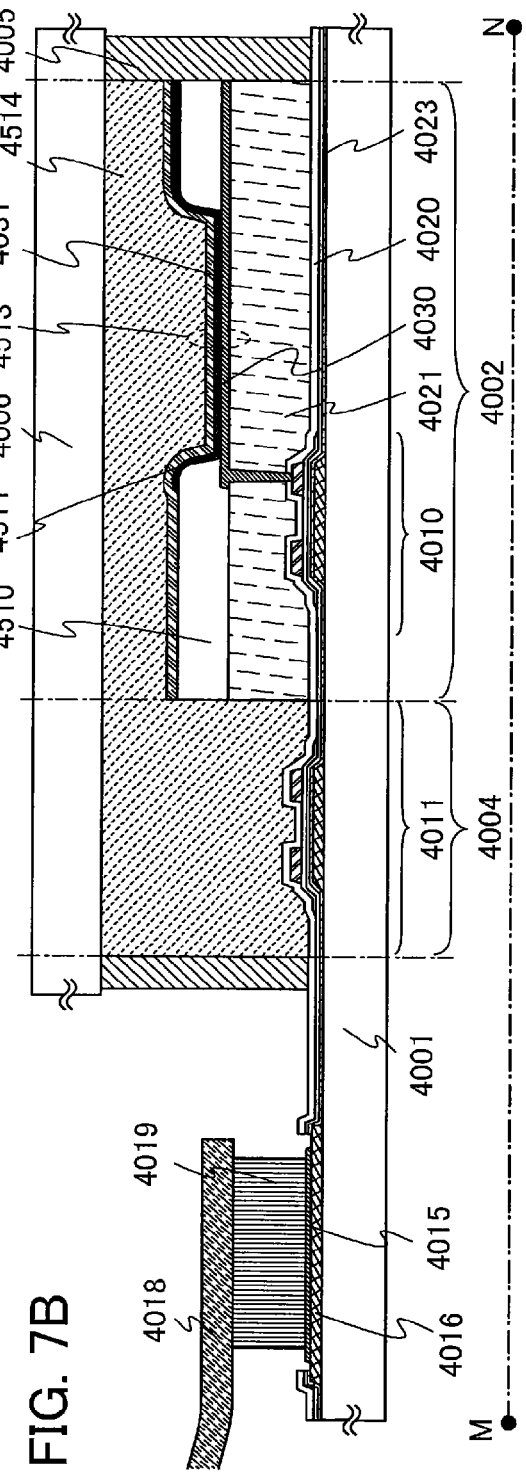

SEMICONDUCTOR DEVICE

BACKGROUND OF THE INVENTION

1. Field of the Invention

The present invention relates to a semiconductor device and a method for manufacturing the semiconductor device.

In this specification and the like, a semiconductor device refers to all types of devices which can function by utilizing semiconductor characteristics; an electro-optical device, a semiconductor circuit, and an electronic device are all semiconductor devices.

2. Description of the Related Art

A technique by which a transistor (also referred to as thin film transistor (TFT)) is formed using a semiconductor thin film formed over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to the transistor. As another material, an oxide semiconductor has been attracting attention.

In the display device, a glass substrate is preferably used as a light-transmitting member.

For example, a transistor whose semiconductor layer including an amorphous oxide containing indium (In), gallium (Ga), and zinc (Zn) (an In—Ga—Zn—O-based amorphous oxide) is formed over a glass substrate is disclosed (see Patent Document 1).

REFERENCE

[Patent Document 1] Japanese Published Patent Application No. 2011-181801

SUMMARY OF THE INVENTION

Improvement in reliability is important for commercialization of semiconductor devices which includes transistors including an oxide semiconductor.

In particular, variation and decrease in electric characteristics of the semiconductor device might reduce the reliability thereof.

In view of the above problem, it is an object to provide a highly reliable semiconductor device which includes a transistor including an oxide semiconductor.

In a semiconductor device including a staggered transistor having a bottom-gate structure provided over a glass substrate, a first gate insulating film and a second gate insulating film are at least provided between a gate electrode layer and an oxide semiconductor film. The first gate insulating film provided on the gate electrode layer side and the second gate insulating film provided on the oxide semiconductor film side have different compositions. A first metal element contained in the glass substrate has a concentration lower than or equal to $5\times10^{18}$ atoms/cm$^3$ (preferably, lower than or equal to $1\times10^{18}$ atoms/cm$^3$) at the interface between the first gate insulating film and the second gate insulating film.

The first gate insulating film can be formed using a thin nitride insulating film. For example, a silicon nitride film and a silicon nitride oxide film can be given. The first gate insulating film may have a single-layer structure or a layered structure. The thickness of the first gate insulating film, which is small, can be made larger than or equal to 30 nm and smaller than or equal to 50 nm.

The first metal element contained in the glass substrate can be prevented from diffusing into the second gate insulating film and the oxide semiconductor film because the first insulating film is provided between the second gate insulating film and the oxide semiconductor film, and the glass substrate.

In a semiconductor device including a staggered transistor having a bottom-gate structure provided over a glass substrate, a protective insulating film is provided between the glass substrate and a gate electrode layer, so that a second metal element contained in the glass substrate has a concentration lower than or equal to $5\times10^{18}$ atoms/cm$^3$ (preferably, lower than or equal to $1\times10^{18}$ atoms/cm$^3$) at the interface between the gate electrode layer and a gate insulating film.

The protective insulating film can be formed using a nitride insulating film. For example, a silicon nitride film and a silicon nitride oxide film can be given. Further, the protective insulating film may have a single-layer structure or a layered structure, in which, for example, a nitride insulating film and an oxide insulating film are stacked in this order from the glass substrate side.

The second metal element contained in the glass substrate can be prevented from diffusing into the transistor because the protective insulating film is provided between the transistor and the glass substrate.

The first metal element contained in the glass substrate is an element which is other than main constituent elements of the first gate insulating film and the second gate insulating film and is diffused from the glass substrate.

The second metal element contained in the glass substrate is an element which is other than main constituent elements of the gate electrode layer and the gate insulating film and is diffused from the glass substrate.

As the first metal element and second metal element which should be reduced so as not to reduce the reliability (stability in characteristics) of the transistors, there are sodium, aluminum, magnesium, calcium, strontium, and barium. Other elements contained in the glass substrate, such as silicon and boron, are preferably reduced to a degree equivalent to those of the above metal elements.

Diffusion of the first metal element or the second metal element contained in the glass substrate, which might cause variation or decrease in electric characteristics of the transistor, can be prevented; therefore, the electric characteristics of the transistor can be stabilized.

Consequently, a highly reliable semiconductor device which includes a transistor including an oxide semiconductor film and having stable electric characteristics can be provided.

One embodiment of a structure of the invention disclosed in this specification is a semiconductor device including a gate electrode layer over a glass substrate; a first gate insulating film over the gate electrode layer; and a second gate insulating film whose composition is different from a composition of the first gate insulating film, an oxide semiconductor film, and source and drain electrode layers which are stacked in this order over the first gate insulating film. In the semiconductor device, a first metal element contained in the glass substrate has a concentration lower than or equal to $5\times10^{18}$ atoms/cm$^3$ at an interface between the first gate insulating film and the second gate insulating film.

Another embodiment of a structure of the invention disclosed in this specification is a semiconductor device including a gate electrode layer over a glass substrate; a first gate insulating film over the gate electrode layer; and a second gate insulating film whose composition is different from a composition of the first gate insulating film, an oxide semiconductor film, an insulating layer which overlaps with the gate electrode layer and is in contact with the oxide semiconductor film, and source and drain electrode layers which are stacked in this order over the first gate insulating film. In the semiconductor device, a first metal element contained in the glass substrate has a concentration lower than or equal to $5\times10^{18}$ atoms/cm$^3$ at an interface between the first gate insulating film and the second gate insulating film.

One embodiment of a structure of the invention disclosed in this specification is a semiconductor device including a protective insulating film over a glass substrate; a gate electrode layer over the protective insulating film; and a gate insulating film, an oxide semiconductor film, and source and drain electrode layers which are stacked in this order over the gate electrode layer. In the semiconductor device, a second metal element contained in the glass substrate has a concentration lower than or equal to $5\times10^{18}$ atoms/cm$^3$ at an interface between the gate electrode layer and the gate insulating film.

Another embodiment of a structure of the invention disclosed in this specification is a semiconductor device including a protective insulating film over a glass substrate; a gate electrode layer over the protective insulating film; and a gate insulating film, an oxide semiconductor film, an insulating layer which overlaps with the gate electrode layer and is in contact with the oxide semiconductor film, and source and drain electrode layers which are stacked in this order over the gate electrode layer. In the semiconductor device, a second metal element contained in the glass substrate has a concentration lower than or equal to $5\times10^{18}$ atoms/cm$^3$ at an interface between the gate electrode layer and the gate insulating film.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, the present invention relates to an LSI, a CPU, a power device which is mounted on a power supply circuit, a semiconductor integrated circuit including a memory, a thyristor, a converter, an image sensor, or the like, an electro-optical device typified by a liquid crystal display device, and a light-emitting display device including a light-emitting element; and an electronic device on which any of the above circuit and devices are mounted as a component.

A highly reliable semiconductor device which includes a transistor including an oxide semiconductor is provided.

BRIEF DESCRIPTION OF THE DRAWINGS

FIGS. 7A and 7B are cross-sectional views each illustrating one embodiment of a semiconductor device.

DETAILED DESCRIPTION OF THE INVENTION

Embodiments of the present invention will be described below in detail with reference to the accompanying drawings. However, the invention disclosed in this specification is not limited to the following description, and it will be easily understood by those skilled in the art that modes and details thereof can be variously changed. Therefore, the invention disclosed in this specification is not construed as being limited to the following description. Note that the ordinal numbers such as "first" and "second" in this specification are used for convenience and do not denote the order of steps and the stacking order of layers. In addition, the ordinal numbers in this specification do not denote particular names which specify the invention.

Embodiment 1

In this embodiment, one embodiment of a semiconductor device and a method for manufacturing the semiconductor device will be described with reference to FIGS. 1A and 1B. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
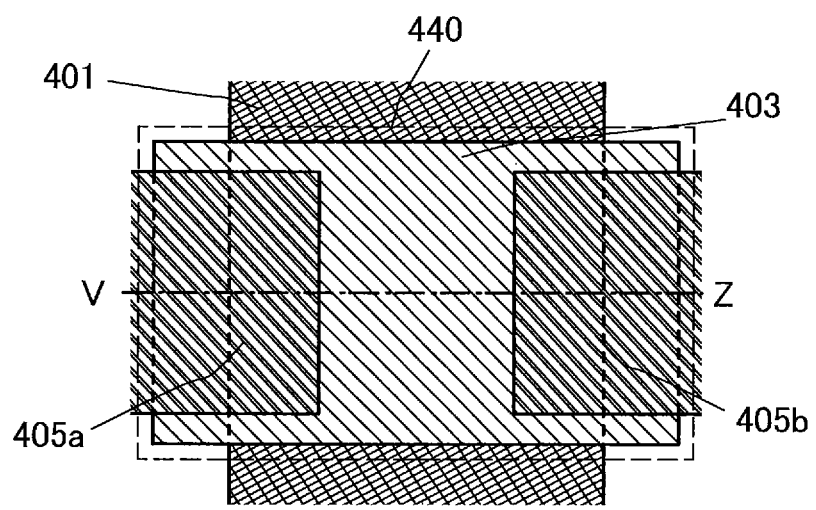
FIGS. 1A and 1B are a plan view and a cross-sectional view illustrating one embodiment of a semiconductor device.
Figure 1B:
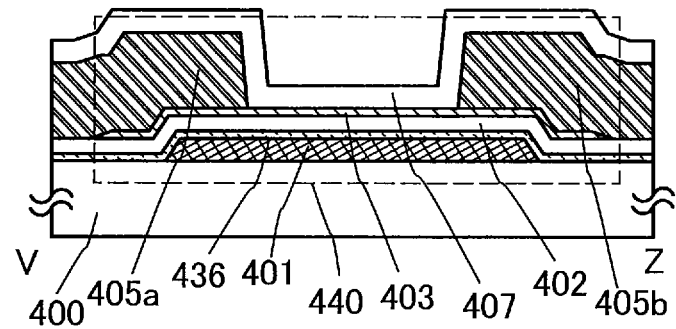

A transistor 440 illustrated in FIGS. 1A and 1B is an example of a transistor which is a kind of bottom-gate transistor and is also referred to as an inverted-staggered transistor. FIG. 1A is a plan view, and FIG. 1B is a cross-sectional view taken along the chain line V-Z in FIG. 1A.

As illustrated in FIG. 1B which is the cross-sectional view of the transistor 440 in a channel length direction, a semiconductor device including the transistor 440 includes, over a glass substrate 400, a gate electrode layer 401 and a first gate insulating film 436 which is provided so as to cover the gate electrode layer 401; and a second gate insulating film 402, an oxide semiconductor film 403, a source electrode layer 405a, and a drain electrode layer 405b which are provided over the first gate insulating film 436. Further, an insulating film 407 covering the transistor 440 is provided.

The first gate insulating film 436 and the second gate insulating film 402 are at least provided between the gate electrode layer 401 and the oxide semiconductor film 403. The first gate insulating film 436 provided on the gate electrode layer 401 side and the second gate insulating film 402 provided on the oxide semiconductor film 403 side have different compositions. In addition, a first metal element contained in the glass substrate 400 has a concentration lower than or equal to $5 \times 10^{18}$ atoms/cm$^3$ (preferably, lower than or equal to $1 \times 10^{18}$ atoms/cm$^3$) at the interface between the first gate insulating film 436 and the second gate insulating film 402. Note that the first metal element contained in the glass substrate 400 is an element which is other than main constituent elements of the first gate insulating film 436 and the second gate insulating film 402 and is diffused from the glass substrate 400.

Note that the concentration of the first metal element contained in the glass substrate 400 is measured by secondary ion mass spectrometry (SIMS).

The first gate insulating film 436 can be formed using a thin nitride insulating film. For example, a silicon nitride film and a silicon nitride oxide film can be given. The thickness of the first gate insulating film 436, which is small, can be made larger than or equal to 30 nm and smaller than or equal to 50 nm The first gate insulating film 436 may have a single-layer structure or a layered structure.

As the first gate insulating film 436 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the first gate insulating film 436, a gallium oxide film, an In—Zr—Zn-based oxide film, an In—Fe—Zn-based oxide film, an In—Ce—Zn-based oxide film, or the like can be used.

The following can be given as examples of the first metal element contained in the glass substrate 400. For example, in the case where the glass substrate 400 is soda-lime glass, sodium, calcium, and the like can be given as a metal element because the components of the soda-lime glass are silicon oxide ($SiO_2$), sodium carbonate ($Na_2CO_3$), and calcium carbonate ($CaCo_3$). In addition, in the case where the glass substrate 400 is a kind of non-alkali glass (glass without soda) which is used for a display panel such as a liquid crystal display panel, its components are $SiO_2$, $Al_2O_3$, $B_2O_3$, and RO (R denotes a bivalent metal element such as magnesium, calcium, strontium, or barium); therefore, aluminum, magnesium, calcium, strontium, and barium can be given as a metal element.

In either case, as the metal element which should be reduced so as not to reduce the reliability (stability in characteristics) of the transistor, there are sodium, aluminum, magnesium, calcium, strontium, and barium. Other elements contained in the glass substrate, such as silicon and boron, are preferably reduced to a degree equivalent to those of the above metal elements.

The first metal element contained in the glass substrate 400 can be prevented from diffusing into the second gate insulating film 402 and the oxide semiconductor film 403 because the first insulating film 436 is provided between the second gate insulating film 402 and the oxide semiconductor film 403, and the glass substrate 400.

When a dense insulating film such as a silicon nitride film is provided as the first gate insulating film 436, movable ions of sodium or the like contained in the glass substrate 400 can be prevented from diffusing into the transistor 440.

Diffusion of the first metal element contained in the glass substrate 400, which might cause variation or decrease in electric characteristics of the transistor 440, can be prevented; therefore, the electric characteristics of the transistor 440 can be stabilized.

When such a metal element exists in the periphery of the gate electrode layer, defects generate in the gate insulating film or at the interface between the gate electrode layer and the gate insulating film, and trap of electric charges in such defects likely to cause variation in electric characteristics of the transistor. For example, it is concerned that, when positive electric charges are trapped in the periphery of the gate electrode layer, the electric characteristics of the transistor might be sifted in the direction of normally-on. Further, when movable ions of sodium or the like are contained in the gate insulating film and positive bias is applied to the gate electrode layer, the positive movable ions transfer to the interface between the gate insulating film and the oxide semiconductor film, which cause electric characteristics of the transistor to shift in the direction of normally-on. Thus, in order to stabilize the electric characteristics of the transistor, it is effective to prevent such a metal element that causes adverse effect from penetrating to the gate insulating film side from the glass substrate.

Consequently, a highly reliable semiconductor device which includes the transistor 440 including the oxide semiconductor film 403 and having stable electric characteristics can be provided.

An oxide semiconductor used for the oxide semiconductor film 403 contains at least indium (In). In particular, In and zinc (Zn) are preferably contained. It is preferable that gallium (Ga) be additionally contained as a stabilizer for reducing a variation in electric characteristics of a transistor including the oxide semiconductor film. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—

Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by a chemical formula $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula $In_2SnO_5(ZnO)_n$ (n>0, n is an integer) may be used.

For example, an In—Ga—Zn-based oxide with an atomic ratio of In:Ga:Zn being 1:1:1 (=1/3:1/3:1/3), 2:2:1 (=2/5:2/5:1/5), or 3:1:2 (=1/2:1/6:1/3), or any of oxides whose composition is in the neighborhood of the above compositions can be used. Alternatively, an In—Sn—Zn-based oxide with an atomic ratio of In:Sn:Zn is 1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, the composition of the oxide semiconductor containing indium is not limited to those described above, and a material having an appropriate composition can be used in accordance with semiconductor characteristics which are necessary (such as mobility, threshold value, and variation). In order to obtain semiconductor characteristics which are necessary, it is preferable that the carrier density, the impurity concentration, the defect density, the atomic ratio of a metal element to oxygen, the interatomic distance, the density, and the like be set as appropriate.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Note that the oxide semiconductor film 403 is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where a crystal portion and an amorphous portion are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing a treatment for crystallization such as a heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness (Ra) of less than or equal to 1 nm, more preferably less than or equal to 0.3 nm, much more preferably less than or equal to 0.1 nm.

Note that an average surface roughness (Ra) is obtained by expanding arithmetic mean surface roughness, which is defined by JIS B0601: 2001 (ISO4287: 1997), into three dimensions so as to be applicable to a curved surface. Moreover, an average surface roughness (Ra) can be expressed as "the average value of the absolute values of deviations from a reference surface to a specific surface" and is defined by the following formula.

$$Ra = \frac{1}{S_0} \int_{y_1}^{y_2} \int_{x_1}^{x_2} |f(x,y) - Z_0| dx\, dy$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). The area of a rectangle which is obtained by projecting the specific surface on the xy plane is represented by $S_0$, and the height of the reference surface (the average height of the specific surface) is represented by $Z_0$. The average surface roughness Ra can be measured using an atomic force microscope (AFM).

Note that since the transistor 440 described in this embodiment is a bottom-gate transistor, the glass substrate 400, the gate electrode layer 401, and the second gate insulating film 402 are located below the oxide semiconductor film. Accordingly, planarization treatment such as CMP treatment may be performed after the gate electrode layer 401 and the second gate insulating film 402 are formed to obtain the above flat surface.

The oxide semiconductor film 403 has a thickness larger than or equal to 1 nm and smaller than or equal to 30 nm (preferably larger than or equal to 5 nm and smaller than or equal to 10 nm) and can be formed by a sputtering method, a molecular beam epitaxy (MBE) method, a CVD method, a pulse laser deposition method, an atomic layer deposition (ALD) method, or the like as appropriate. Alternatively, the oxide semiconductor film 403 may be formed with a sputtering apparatus where deposition is performed with surfaces of a plurality of substrates set substantially perpendicular to a surface of a sputtering target.

For example, the CAAC-OS film is formed by a sputtering method with a polycrystalline oxide semiconductor sputtering target. When ions collide with the sputtering target, a crystal region included in the sputtering target may be cleaved along an a-b plane, and a sputtered particle having a plane parallel to an a-b plane (flat-plate-like sputtered particle or pellet-like sputtered particle) may separate from the sputtering target. In that case, the flat-plate-like sputtered particle reaches a substrate while maintaining their crystal state, whereby the CAAC-OS film can be formed.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Further, it is preferable that the proportion of oxygen in the deposition gas be increased and the power be optimized in order to reduce plasma damage at the deposition. The proportion of oxygen in the deposition gas is higher than or equal to 30 vol. %, preferably 100 vol. %.

As an example of the sputtering target, an In—Ga—Zn—O compound target is described below.

The In—Ga—Zn—O compound target, which is polycrystalline, is made by mixing $InO_x$ powder, $GaO_y$ powder, and $ZnO_z$ powder in a predetermined molar ratio, applying pressure, and performing a heat treatment at a temperature higher than or equal to 1000° C. and lower than or equal to 1500° C. Note that x, y, and z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

FIGS. 2A to 2E illustrate an example of a method for manufacturing a semiconductor device including the transistor 440.

There is no particular limitation on a substrate that can be used as the glass substrate 400 as long as it has heat resistance enough to withstand a heat treatment performed later. For example, a barium borosilicate glass substrate, an aluminoborosilicate glass substrate, or the like can be used.

The glass substrate 400 may be subjected to a heat treatment. For example, the heat treatment can be performed at 650° C. for 1 minute to 5 minutes with a gas rapid thermal annealing (GRTA) apparatus which performs a heat treatment using a high-temperature gas. As the high-temperature gas in the GRTA apparatus, an inert gas which does not react by a heat treatment with an object to be processed, such as nitrogen or a rare gas like argon, is used. Alternatively, the heat treatment may be performed at 500° C. for 30 minutes to an hour with an electric furnace.

Figure 2A:
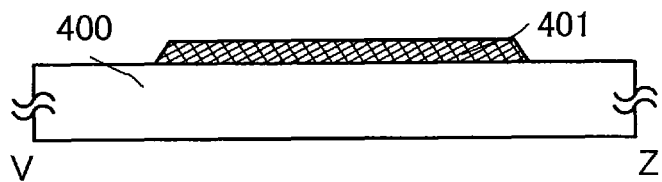
FIGS. 2A to 2E are cross-sectional views illustrating one embodiment of a method for manufacturing a semiconductor device.

Next, a conductive film is formed over the glass substrate 400 and is etched into the gate electrode layer 401 (see FIG. 2A). Note that the conductive film may be etched using either dry etching or wet etching, or using both dry etching and wet etching.

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a layered structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a layered structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV, preferably higher than or equal to 5.5 eV, and the use of this film as the gate electrode layer enables the threshold voltage of electric characteristics of a transistor to be positive. Accordingly, a normally-off switching element can be obtained.

In this embodiment, a tungsten film with a thickness of 100 nm is formed by a sputtering method.

The glass substrate 400 and the gate electrode layer 401 may be subjected to a heat treatment after the gate electrode layer 401 is formed. For example, the heat treatment can be performed at 650° C. for 1 minute to 5 minutes with a GRTA apparatus. Alternatively, the heat treatment may be performed at 500° C. for 30 minutes to an hour with an electric furnace.

Figure 2B:
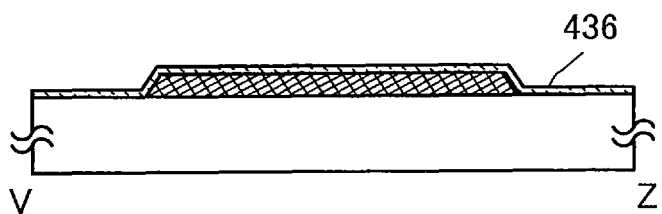

Next, the first gate insulating film 436 is provided so as to cover the gate electrode layer 401 (see FIG. 2B).

The first gate insulating film 436 can be formed using a nitride insulating film formed by a plasma-enhanced CVD method, a sputtering method, or the like. For example, a silicon nitride film and a silicon nitride oxide film can be given. The first gate insulating film 436 may have a single-layer structure or a layered structure.

As the first gate insulating film 436 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the first gate insulating film 436, a gallium oxide film, an In—Zr—Zn-based oxide film, an In—Fe—Zn-based oxide film, an In—Ce—Zn-based oxide film, or the like can be used.

In this embodiment, as the first gate insulating film 436, a silicon nitride film with a thickness of 30 nm which is formed by a plasma-enhanced CVD method is used.

Next, the second gate insulating film 402 is formed over the first gate insulating film 436.

Since the gate electrode layer 401 is covered with the first gate insulating film 436, the first metal element contained in the glass substrate 400 can be prevented from diffusing into the second gate insulating film 402 even when the first metal element is attached to the surface of the gate electrode layer 401 in the etching step for forming the gate electrode layer 401.

The second gate insulating film 402 has a thickness larger than or equal to 1 nm and smaller than or equal to 20 nm and can be formed by a sputtering method, a MBE method, a CVD method, a pulse laser deposition method, an ALD method, or the like as appropriate. Alternatively, the second gate insulating film 402 may be formed with a sputtering apparatus where deposition is performed with surfaces of a plurality of substrates set substantially perpendicular to a surface of a sputtering target.

The second gate insulating film 402 can be formed using a silicon oxide film, a gallium oxide film, an aluminum oxide film, a silicon nitride film, a silicon oxynitride film, an aluminum oxynitride film, or a silicon nitride oxide film.

The second gate insulating film 402 can be formed using a high-k material such as a hafnium oxide film, a yttrium oxide film, a hafnium silicate film (HfSi$_x$O$_y$ (x>0, y>0)), a hafnium silicate film (HfSiO$_x$N$_y$ (x>0, y>0)) to which nitrogen is added, a hafnium aluminate film (HfAl$_x$O$_y$ (x>0, y>0)), or a lanthanum oxide film, whereby gate leakage current can be reduced. Further, the second gate insulating film 402 may have either a single-layer structure or a layered structure.

It is preferable that the second gate insulating film 402 include oxygen in a portion which is in contact with the oxide semiconductor film 403. In particular, the second gate insulating film 402 preferably contains, in the film (bulk), oxygen whose content is in excess of the oxygen content in the stoichiometric composition. For example, in the case where a silicon oxide film is used as the second gate insulating film 402, the composition formula is SiO$_{2+\alpha}$ ($\alpha$>0).

The second gate insulating film 402 including much (excessive) oxygen, which serves as an oxygen supply source, can be provided so as to be in contact with the oxide semiconductor film 403, whereby oxygen can be supplied to the oxide semiconductor film 403 from the second gate insulating film 402. Alternatively, a heat treatment may be performed in the state where the oxide semiconductor film 403 and the second gate insulating film 402 are at least partly in contact with each other to supply oxygen to the oxide semiconductor film 403.

By supply of oxygen to the oxide semiconductor film 403, oxygen vacancies in the film can be repaired. Further, the second gate insulating film 402 is preferably formed in consideration of the size of a transistor to be formed and the step coverage with the second gate insulating film 402.

In this embodiment, a silicon oxynitride film with a thickness of 200 nm is formed by a high-density plasma-enhanced CVD method.

Moreover, the glass substrate 400, the gate electrode layer 401, the first gate insulating film 436, and the second gate insulating film 402 may be subjected to a heat treatment after the second gate insulating film 402 is formed. For example, the heat treatment can be performed at 650° C. for 1 minute to 5 minutes with a GRTA apparatus. Alternatively, the heat treatment may be performed at 500° C. for 30 minutes to an hour with an electric furnace.

Figure 2C:
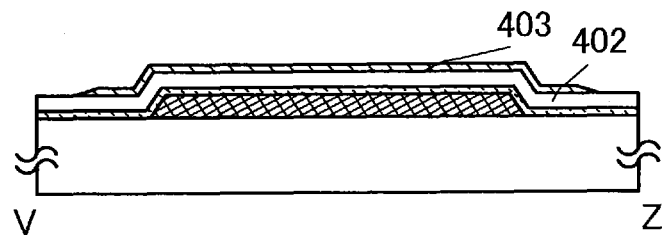

Next, the oxide semiconductor film 403 is formed over the second gate insulating film 402 (see FIG. 2C).

In order that hydrogen or water will not enter the oxide semiconductor film 403 as much as possible in the formation step of the oxide semiconductor film 403, the substrate over which the second gate insulating film 402 is provided is preferably preheated in a preheating chamber in a sputtering apparatus as a pretreatment for formation of the oxide semiconductor film 403 so that impurities such as hydrogen and moisture adsorbed onto the substrate and the second gate insulating film 402 are eliminated and evacuated. As an evacuation unit provided in the preheating chamber, a cryopump is preferable.

A planarization treatment may be performed on the region of the second gate insulating film 402 which is in contact with the oxide semiconductor film 403. As the planarization treatment, a polishing treatment (e.g., a chemical mechanical polishing (CMP) method), a dry etching treatment, or a plasma treatment can be used, though there is no particular limitation on the planarization treatment.

As a plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the second gate insulating film 402.

As the planarization treatment, a polishing treatment, a dry etching treatment, or a plasma treatment may be performed plural times, or these treatments may be performed in combination. In the case where the treatments are combined, the order of steps is not particularly limited and may be set as appropriate depending on the roughness of the surface of the second gate insulating film 402.

Note that it is preferable that the oxide semiconductor film 403 be formed under a condition that much oxygen is contained during film formation (e.g., deposited by a sputtering method in a 100% oxygen atmosphere), so that a film containing much oxygen (preferably including a region containing oxygen in excess of the stoichiometric composition of an oxide semiconductor in a crystalline state) is formed.

Note that in this embodiment, as the oxide semiconductor film 403, an In—Ga—Zn-based oxide film (IGZO film) with a thickness of 35 nm is formed by a sputtering method with a sputtering apparatus including an AC power supply device. In this embodiment, an In—Ga—Zn-based oxide target with an atomic ratio of In:Ga:Zn being 1:1:1 (=1/3:1/3:1/3) is used. Note that deposition conditions are as follows: atmosphere, oxygen gas and argon gas (the flow rate of oxygen: 50%); pressure, 0.6 Pa; electric power, 5 kW; and substrate temperature, 170° C. Here, the deposition rate is 16 nm/min.

It is preferable that a high-purity gas from which an impurity such as hydrogen, water, a hydroxyl group, or hydride is removed be used as a sputtering gas when the oxide semiconductor film 403 is deposited.

The substrate is held in a deposition chamber kept under reduced pressure. Then, a sputtering gas from which hydrogen and moisture are removed is introduced while residual moisture in the deposition chamber is removed, and the oxide semiconductor film 403 is deposited over the glass substrate 400 using the above target. In order to remove the residual moisture in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are evacuated, whereby the concentration of an impurity contained in the oxide semiconductor film 403 deposited in the deposition chamber can be reduced.

It is preferable to form the second gate insulating film 402 and the oxide semiconductor film 403 in succession so as not to expose the second gate insulating film 402 to the air. Forming the second gate insulating film 402 and the oxide semiconductor film 403 in succession so as not to expose the second gate insulating film 402 to the air can prevent impurities such as hydrogen and moisture from being adsorbed onto the surface of the second gate insulating film 402.

The oxide semiconductor film 403 can be formed by processing an oxide semiconductor film into an island shape by a photolithography process.

Further, a resist mask for forming the island-shaped oxide semiconductor film 403 may be formed by an ink-jet method. Formation of the resist mask by an ink jet method needs no photomask; thus, manufacturing cost can be reduced.

Note that the etching of the oxide semiconductor film may be performed using either dry etching or wet etching, or using both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used. Further alternatively, the oxide semiconductor film may be etched by a dry etching method using an inductively coupled plasma (ICP) etching method.

Further, a heat treatment may be performed on the oxide semiconductor film 403 in order to remove excess hydrogen (including water and a hydroxyl group) (to perform a dehydration or dehydrogenation treatment). The temperature of the heat treatment is higher than or equal to 300° C. and lower than or equal to 700° C., or lower than the strain point of the substrate. The heat treatment can be performed under reduced pressure, in a nitrogen atmosphere, or the like.

In addition, in the case where a crystalline oxide semiconductor film is used as the oxide semiconductor film 403, a heat treatment for crystallization may be performed.

In this embodiment, the substrate is introduced into an electric furnace which is one of heat treatment apparatuses, and the oxide semiconductor film 403 is subjected to a heat treatment at 450° C. in a nitrogen atmosphere for an hour and then subjected to another heat treatment at 450° C. in an atmosphere containing nitrogen and oxygen for an hour.

Note that the heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, a heat treatment is performed using a high-temperature gas. As the high-temperature gas, an inert gas which does not react by a heat treatment with an object to be processed, such as nitrogen or a rare gas like argon, is used.

For example, as the heat treatment, GRTA may be performed as follows. The substrate is put in an inert gas heated at high temperature of 650° C. to 700° C., heated for several minutes, and taken out of the inert gas.

Note that in a heat treatment, it is preferable that moisture, hydrogen, and the like be not contained in nitrogen or a rare gas such as helium, neon, or argon. Alternatively, it is preferable that the purity of nitrogen or the rare gas such as helium, neon, or argon which is introduced into the heat treatment apparatus be set to be higher than or equal to 6N (99.9999%), more preferably higher than or equal to 7N (99.99999%) (i.e., the concentration of impurities is lower than or equal to 1 ppm, preferably lower than or equal to 0.1 ppm).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably higher than or equal to 6N, more preferably higher than or equal to 7N (i.e., the impurity concentration in the oxygen gas or the dinitrogen monoxide gas is preferably lower than or equal to 1 ppm, more preferably lower than or equal to 0.1 ppm). The oxygen gas or the dinitrogen monoxide gas acts to supply oxygen that is a main component of the oxide semiconductor and that is reduced by the step for removing an impurity for the dehydration or dehydrogenation, so that the oxide semiconductor film 403 can be a high-purified and i-type (intrinsic) oxide semiconductor film.

The timing of the heat treatment for dehydration or dehydrogenation may be either after the formation of the oxide semiconductor film or after the formation of the island-shaped oxide semiconductor film 403.

The heat treatment for dehydration or dehydrogenation may be performed plural times and may also serve as another heat treatment.

It is preferable that the heat treatment for dehydration or dehydrogenation be performed in a state where the second gate insulating film 402 is covered with the oxide semiconductor film which has not been processed into the island-shaped oxide semiconductor film 403 because oxygen contained in the second gate insulating film 402 can be prevented from being released by the heat treatment.

Further or alternatively, oxygen (which includes at least one of an oxygen radical, an oxygen atom, and an oxygen ion) may be added to the oxide semiconductor film 403 which has been subjected to a dehydration or dehydrogenation treatment to supply oxygen to the oxide semiconductor film 403.

The dehydration or dehydrogenation treatment may be accompanied by elimination of oxygen which is a main constituent material for an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Thus, oxygen (which includes at least one of an oxygen radical, an oxygen atom, and an oxygen ion) is preferably added to the oxide semiconductor film which has been subjected to the dehydration or dehydrogenation treatment to supply oxygen to the oxide semiconductor film. By supply of oxygen to the oxide semiconductor film, oxygen vacancies in the film can be repaired.

Oxygen is added to the oxide semiconductor film 403 which has been subjected to the dehydration or dehydrogenation treatment to supply oxygen to the film, so that the oxide semiconductor film 403 can be a high-purified and i-type (intrinsic) oxide semiconductor film. Variation in electric characteristics of the transistor including the highly-purified and i-type (intrinsic) oxide semiconductor film 403 is suppressed, and the transistor is electrically stable.

As a method for adding oxygen, an ion implantation method, an ion doping method, a plasma immersion ion implantation method, a plasma treatment, or the like can be used.

In the step of addition of oxygen to the oxide semiconductor film 403, oxygen may be directly added to the oxide semiconductor film 403 or to the oxide semiconductor film 403 through another film such as the insulating film 407. An ion implantation method, an ion doping method, a plasma immersion ion implantation method, or the like can be employed for the addition of oxygen through another film, whereas a plasma treatment or the like can also be employed for the direct addition of oxygen to the exposed oxide semiconductor film 403.

Although the addition of oxygen to the oxide semiconductor film 403 is preferably performed after the dehydration or dehydrogenation treatment is performed thereon, the timing of the addition of oxygen is not particularly limited. Further, oxygen may be added plural times to the oxide semiconductor film 403 which has been subjected to the dehydration or dehydrogenation treatment.

Further, it is preferable that the oxide semiconductor film provided in the transistor include a region containing oxygen in excess of the stoichiometric composition of an oxide semiconductor in a crystalline state. In this case, the oxygen content is preferably higher than that in the stoichiometric composition of the oxide semiconductor. Alternatively, the oxygen content is higher than that of the oxide semiconductor in a single crystal state. In some cases, oxygen exists between lattices of the oxide semiconductor.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$). Accordingly, by using the oxide semiconductor film for the transistor, fluctuation in the threshold voltage $V_{th}$ of the transistor and a shift of the threshold voltage $\Delta V_{th}$ which are due to oxygen vacancies can be reduced.

Next, a conductive film to be the source electrode layer and the drain electrode layer (including a wiring formed in the same layer as the source electrode layer and the drain electrode layer) is formed over the gate electrode layer 401, the first gate insulating film 436, the second gate insulating film 402, and the oxide semiconductor film 403.

The conductive film is formed using a material that can withstand a heat treatment in a later step. As the conductive film used for the source electrode layer and the drain electrode layer, it is possible to use, for example, a metal film containing an element selected from Al, Cr, Cu, Ta, Ti, Mo, and W, a metal nitride film containing any of these elements as its component (e.g., a titanium nitride film, a molybdenum nitride film, or a tungsten nitride film), or the like. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Figure 2D:
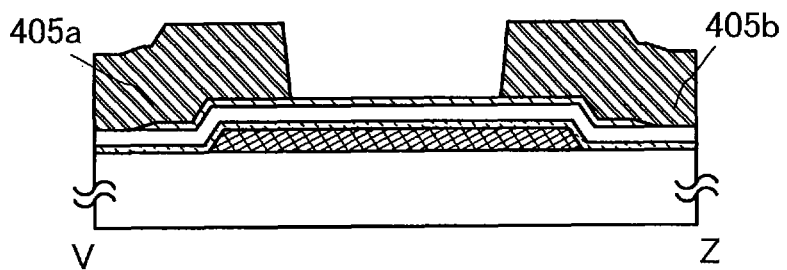

Through a photolithography process, a resist mask is formed over the conductive film, and the source electrode layer 405a and the drain electrode layer 405b are formed by selective etching (see FIG. 2D). After the source electrode layer 405a and the drain electrode layer 405b are formed, the resist mask is removed.

Ultraviolet, KrF laser light, ArF laser light, or the like can be used for light exposure at the time of forming a resist mask. The channel length L of the transistor 440 that is to be completed later is determined by a distance between bottom edges of the source electrode layer 405a and the drain electrode layer 405b which are adjacent to each other over the oxide semiconductor film 403. In the case where the channel length L is less than 25 nm, the light exposure at the time of forming the resist mask can be performed using extreme ultraviolet having an extremely short wavelength of several nanometers to several tens of nanometers. In the light exposure by extreme ultraviolet light, the resolution is high and the focus depth is large. Therefore, the channel length L of the transistor that is to be completed later can be greater than or equal to 10 nm and less than or equal to 1000 nm, which enables high operation speed of a circuit.

In order to reduce the number of photomasks used in the photolithography process and reduce the number of photolithography processes, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography processes can also be reduced, whereby the process can be simplified.

In this embodiment, the conductive film can be etched using a gas containing chlorine, for example, a gas containing chlorine ($Cl_2$), boron trichloride ($BCl_3$), silicon tetrachloride ($SiCl_4$), or carbon tetrachloride ($CCl_4$). Alternatively, a gas containing fluorine, for example, a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As the etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: etching gas, $BCl_3:Cl_2=750$ sccm: 150 sccm; bias power, 1500 W; ICP power, 0 W; and pressure, 2.0 Pa. The second etching conditions are as follows: etching gas, $BCl_3:Cl_2=700$ sccm: 100 sccm; bias power, 750 W; ICP power, 0 W; and pressure, 2.0 Pa.

Note that it is preferable that etching conditions be optimized so as not to etch and divide the oxide semiconductor film 403 when the conductive film is etched. However, it is difficult to obtain etching conditions in which only the conductive film is etched and the oxide semiconductor film 403 is not etched at all. In some cases, part of the oxide semiconductor film 403 is etched off through the etching of the conductive film, so that an oxide semiconductor film having a groove (depressed portion) is formed.

Through the above-described process, the transistor 440 of this embodiment is formed.

Figure 2E:
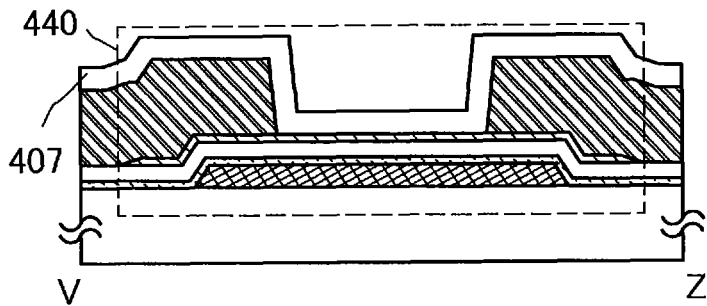

In this embodiment, the insulating film 407 is formed over the source electrode layer 405a and the drain electrode layer 405b and in contact with the oxide semiconductor film 403 (see FIG. 2E).

The insulating film 407 can be formed with a thickness of at least 1 nm by a method by which impurities such as water and hydrogen do not enter the insulating film 407, such as a sputtering method, as appropriate. When hydrogen is contained in the insulating film 407, entry of the hydrogen to the oxide semiconductor film 403, or extraction of oxygen from the oxide semiconductor film by hydrogen may occur, in which case the back channel in the oxide semiconductor film 403 may have lower resistance (become n-type), so that a parasitic channel might be formed. Therefore, it is important that a film formation method in which hydrogen is not used is employed in order to form the insulating film 407 containing as little hydrogen as possible.

As the insulating film 407, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

Oxygen is preferably supplied to the oxide semiconductor film 403 when the heating step for a dehydration or dehydrogenation treatment is performed. By supply of oxygen to the oxide semiconductor film 403, oxygen vacancies in the film can be repaired.

In this embodiment, oxygen is supplied to the oxide semiconductor film 403 using the insulating film 407 as a supply source, and thus an example in which an oxide insulating film containing oxygen (e.g., a silicon oxide film or a silicon oxynitride film) is used as the insulating film 407 is described. In the case where the insulating film 407 is used as a supply source of oxygen, the insulating film 407 can favorably function as the supply source of oxygen when being a film containing much (excessive) oxygen (preferably, a film including a region containing oxygen in excess of the stoichiometric composition of an oxide semiconductor in a crystalline state).

In this embodiment, as the insulating film 407, a silicon oxide film with a thickness of 300 nm is formed by a sputtering method. The substrate temperature in film formation may be higher than or equal to room temperature and lower than or equal to 300° C. and in this embodiment is 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target can be used. For example, with the use of a silicon target, a silicon oxide film can be formed by a sputtering method in an atmosphere containing oxygen.

In order to remove the residual moisture from the deposition chamber of the insulating film 407 in a manner similar to that of the formation of the oxide semiconductor film 403, an entrapment vacuum pump (such as a cryopump) is preferably used. When the insulating film 407 is deposited in the deposition chamber evacuated using a cryopump, the impurity concentration of the insulating film 407 can be reduced. As an evacuation unit for removing the residual moisture in the deposition chamber of the insulating film 407, a turbo molecular pump provided with a cold trap may be used.

It is preferable that a high-purity gas in which an impurity such as hydrogen or water is reduced be used as the sputtering gas for the deposition of the insulating film 407.

Next, the oxide semiconductor film 403 part of which (a channel formation region) is in contact with the insulating film 407 is subjected to a heating step.

The heating step is performed at a temperature higher than or equal to 250° C. and lower than or equal to 700° C., preferably higher than or equal to 400° C. and lower than or equal to 700° C., or lower than the strain point of the substrate. For example, the substrate is introduced into an electric furnace which is one of heat treatment apparatuses, and the heating step is performed on the oxide semiconductor film at 250° C. in a nitrogen atmosphere for an hour.

For the heating step, a heating method and a heating apparatus similar to those for the heating step where a dehydration or dehydrogenation treatment is performed can be employed.

The heating step may be performed under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, more preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. Alternatively, it is preferable that the purity of nitrogen, oxygen, or the rare gas which is introduced into the heat treatment apparatus be set to be higher than or equal to 6N (99.9999%), more preferably higher than or equal to 7N (99.99999%) (i.e., the concentration of impurities is lower than or equal to 1 ppm, preferably lower than or equal to 0.1 ppm).

The oxide semiconductor film 403 and the insulating film 407 containing oxygen are in contact with each other when being subjected to the heating step; thus, oxygen that is one of the main components of the oxide semiconductor film 403 and that is reduced by the step for removing an impurity can be supplied from the insulating film 407 containing oxygen to the oxide semiconductor film 403.

Alternatively, a dense inorganic insulating film may be provided over the insulating film 407. For example, an aluminum oxide film is formed over the insulating film 407 by a sputtering method. Providing an aluminum oxide film having high density (film density: 3.2 g/cm$^3$ or higher, preferably 3.6 g/cm$^3$ or higher) can stabilize the electric characteristics of the transistor 440. The film density can be measured by Rutherford backscattering spectrometry (RBS) or X-ray reflection (XRR).

The aluminum oxide film which can be used as the insulating film 407 provided over the transistor 440 has a high shielding effect (blocking effect) of preventing penetration of both oxygen and an impurity such as hydrogen or moisture through the film.

Therefore, during the manufacturing process and after the manufacture, the aluminum oxide film functions as a protective film for preventing entry of an impurity such as hydrogen or moisture which might cause variation in electric characteristics into the oxide semiconductor film 403, and release of oxygen which is a main component material of the oxide semiconductor from the oxide semiconductor film 403.

Further, a planarization insulating film may be formed thereover in order to reduce surface roughness due to the transistor 440. As the planarization insulating film, an organic material such as a polyimide resin, an acrylic resin, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

For example, an acrylic resin film with a thickness of 1500 nm is formed as the planarization insulating film. The acrylic resin film can be formed in such a manner that the top surface of the transistor 440 is coated with an acrylic resin by a coating method and then baking (e.g., at 250° C. in a nitrogen atmosphere for an hour) is performed.

A heat treatment may be performed after the planarization insulating film is formed. For example, the heat treatment is performed at 250° C. in a nitrogen atmosphere for an hour.

As described above, a heat treatment may be performed after the transistor 440 is formed. The heat treatment may be performed more than once.

The first metal element contained in the glass substrate 400 can be prevented from diffusing into the second gate insulating film 402 and the oxide semiconductor film 403 because the first insulating film 436 is provided between the second gate insulating film 402 and the oxide semiconductor film 403, and the glass substrate 400.

Diffusion of the first metal element contained in the glass substrate 400, which might cause variation or decrease in electric characteristics of the transistor 440, can be prevented; therefore, the electric characteristics of the transistor 440 can be stabilized.

Consequently, a highly reliable semiconductor device which includes the transistor 440 including the oxide semiconductor film 403 and having stable electric characteristics can be provided. Further, the highly reliable semiconductor device can be manufactured at high yield, whereby high productivity can be achieved.

Embodiment 2

In this embodiment, another embodiment of a semiconductor device and a method for manufacturing the semiconductor device will be described with reference to FIGS. 3A and 3B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 3A:
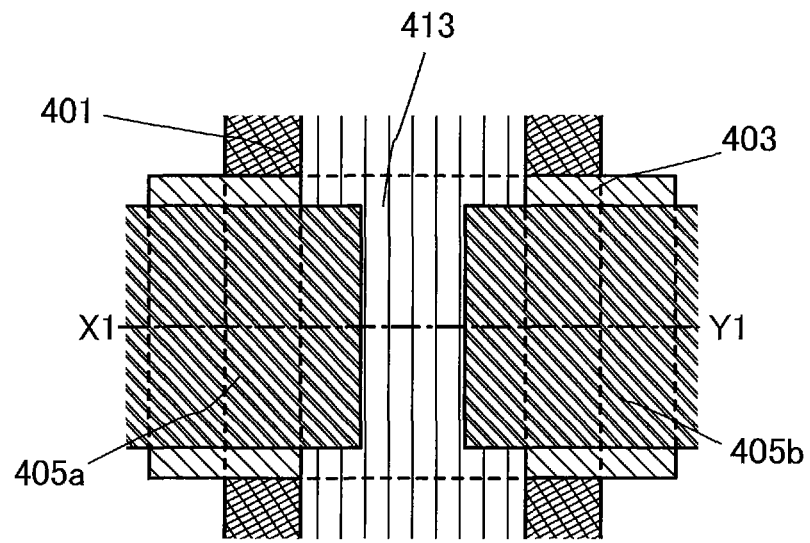
FIGS. 3A and 3B are a plan view and a cross-sectional view illustrating one embodiment of a semiconductor device.
Figure 3B:
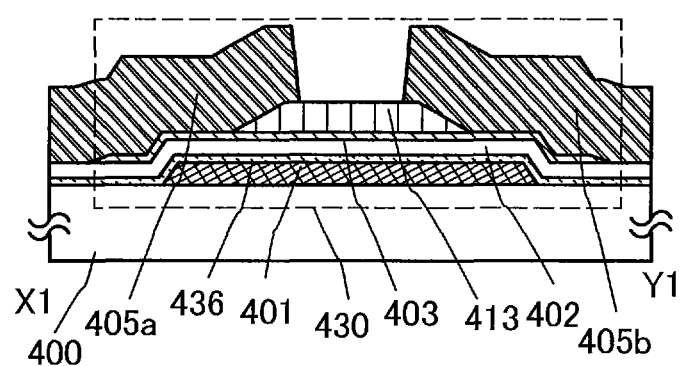

A transistor 430 illustrated in FIGS. 3A and 3B is an example of a transistor which is a kind of bottom-gate transistor referred to as a channel-protective transistor (also referred to as a channel-stop transistor) and is also referred to as an inverted-staggered transistor. FIG. 3A is a plan view, and FIG. 3B is a cross-sectional view taken along the chain line X1-Y1 in FIG. 3A.

As illustrated in FIG. 3B which is the cross-sectional view of the transistor 430 in a channel length direction, a semiconductor device including the transistor 430 includes, over the glass substrate 400, the gate electrode layer 401 and the first gate insulating film 436 which is provided so as to cover the gate electrode layer 401; and the second gate insulating film 402, the oxide semiconductor film 403, the source electrode layer 405a, and the drain electrode layer 405b which are provided over the first gate insulating film 436. Further, an insulating layer 413 which is in contact with the oxide semiconductor film 403 is provided.

The first gate insulating film 436 and the second gate insulating film 402 are at least provided between the gate electrode layer 401 and the oxide semiconductor film 403. The first gate insulating film 436 provided on the gate electrode layer 401 side and the second gate insulating film 402 provided on the oxide semiconductor film 403 side have different compositions. In addition, a first metal element contained in the glass substrate 400 has a concentration lower than or equal to $5 \times 10^{18}$ atoms/cm$^3$ (preferably, lower than or equal to $1 \times 10^{18}$ atoms/cm$^3$) at the interface between the first gate insulating film 436 and the second gate insulating film 402.

The first gate insulating film 436 can be formed using a thin nitride insulating film. For example, a silicon nitride film and a silicon nitride oxide film can be given. The first gate insulating film 436 may have a single-layer structure or a layered structure. The thickness of the first gate insulating film 436, which is small, can be made larger than or equal to 30 nm and smaller than or equal to 50 nm.

As the metal element which should be reduced so as not to reduce the reliability (stability in characteristics) of the transistor 430, there are sodium, aluminum, magnesium, calcium, strontium, and barium. Other elements contained in the glass substrate 400, such as silicon and boron, are preferably reduced to a degree equivalent to those of the above metal elements.

The insulating layer 413 in contact with the oxide semiconductor film 403 is provided over a channel formation region of the oxide semiconductor film 403, which overlaps with the gate electrode layer 401, and functions as a channel protective film.

The cross-sectional shape of the insulating layer 413 which is over and overlaps with the channel formation region, specifically, the cross-sectional shape (e.g., taper angle and thickness) of an end portion of the insulating layer 413 is adjusted, so that electric-field concentration which might occur in the vicinity of an end portion of the drain electrode layer 405b can be reduced and degradation of the switching characteristics of the transistor 430 can be suppressed.

Specifically, the cross-sectional shape of the insulating layer 413 which is over and overlaps with the channel formation region is set to a trapezoid or a triangle, and the taper angle of a lower end portion of the cross-sectional shape is set to be less than or equal to 60°, preferably less than or equal to 45°, further preferably less than or equal to 30°. Setting the taper angle within such a range makes it possible to reduce the electric-field concentration which might occur in the vicinity of the end portion of the drain electrode layer 405b when a high gate voltage is applied to the gate electrode layer 401.

The thickness of the insulating layer 413 which is over and overlaps with the channel formation region is less than or equal to 0.3 μm, preferably greater than or equal to 5 nm and less than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occur in the vicinity of the end portion of the drain electrode layer 405b.

An example of a method for manufacturing the semiconductor device including the transistor 430 will be described below.

First, a conductive film is formed over the glass substrate 400 having an insulating surface and is etched into the gate electrode layer 401. In this embodiment, a tungsten film with a thickness of 100 nm is formed by a sputtering method.

Next, the first gate insulating film 436 is provided so as to cover the gate electrode layer 401.

The first gate insulating film 436 can be formed using a nitride insulating film formed by a plasma-enhanced CVD method, a sputtering method, or the like. For example, a silicon nitride film and a silicon nitride oxide film can be given. The first gate insulating film 436 may have a single-layer structure or a layered structure.

As the first gate insulating film 436 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the first gate insulating film 436, a gallium oxide film, an In—Zr—Zn-based oxide film, an In—Fe—Zn-based oxide film, an In—Ce—Zn-based oxide film, or the like can be used.

In this embodiment, as the first gate insulating film 436, a silicon nitride film with a thickness of 30 nm which is formed by a plasma-enhanced CVD method is used.

Since the gate electrode layer 401 is covered with the first gate insulating film 436, the first metal element contained in the glass substrate 400 can be prevented from diffusing into the second gate insulating film 402 even when the first metal element is attached to the surface of the gate electrode layer 401 in the etching step for forming the gate electrode layer 401.

Next, the second gate insulating film 402 is formed over the first gate insulating film 436. In this embodiment, a silicon oxynitride film with a thickness of 300 nm is formed by a plasma-enhanced CVD method.

Next, the oxide semiconductor film 403 is formed over the second gate insulating film 402. Note that in this embodiment, as the oxide semiconductor film 403, an In—Ga—Zn-based oxide film (IGZO film) with a thickness of 35 nm is formed by a sputtering method with a sputtering apparatus including an AC power supply device. In this embodiment, an In—Ga—Zn-based oxide target with an atomic ratio of In:Ga:Zn being 1:1:1 (=1/3:1/3:1/3) is used. Note that deposition conditions are as follows: atmosphere, oxygen gas and argon gas (the flow rate of oxygen: 50%); pressure, 0.6 Pa; electric power, 5 kW; and substrate temperature, 170° C. Here, the deposition rate is 16 nm/min.

Further, a heat treatment may be performed on the oxide semiconductor film 403 in order to remove excess hydrogen (including water and a hydroxyl group) (to perform a dehydration or dehydrogenation treatment). In this embodiment, the substrate is introduced into an electric furnace which is one of heat treatment apparatuses, and the oxide semiconductor film 403 is subjected to a heat treatment at 450° C. in a nitrogen atmosphere for an hour and then subjected to another heat treatment at 450° C. in an atmosphere containing nitrogen and oxygen for an hour.

Next, the insulating layer 413 is formed over the channel formation region of the oxide semiconductor film 403, which overlaps with the gate electrode layer 401.

The insulating layer 413 can be formed by etching an insulating film which is formed by a plasma-enhanced CVD method or a sputtering method. As the insulating layer 413, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

When the insulating layer 413 in contact with the oxide semiconductor film 403 (or a film in contact with the oxide semiconductor film 403 in the case where the insulating layer 413 has a layered structure) contains much oxygen, the insulating layer 413 (or the film in contact with the oxide semiconductor film 403) can favorably function as a supply source which supplies oxygen to the oxide semiconductor film 403.

In this embodiment, as the insulating layer 413, a silicon oxide film with a thickness of 200 nm is formed by a sputtering method. The silicon oxide film is selectively etched to form the insulating layer 413 having a trapezoidal or triangular cross-sectional shape whose taper angle at the lower end portion is less than or equal to 60°, preferably less than or equal to 45°, further preferably less than or equal to 30°. The planar shape of the insulating layer 413 is a rectangle. In this embodiment, a resist mask is formed over the silicon oxide film through a photolithography process, and selective etching is performed to form a taper with an angle of about 30° at the lower end portion of the insulating layer 413.

A heat treatment may be performed after the insulating layer 413 is formed. In this embodiment, the heat treatment is performed at 300° C. in a nitrogen atmosphere for an hour.

Next, a conductive film to be the source electrode layer and the drain electrode layer is formed over the gate electrode layer 401, the first gate insulating film 436, the second gate insulating film 402, the oxide semiconductor film 403, and the insulating layer 413.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: etching gas, $BCl_3:Cl_2=750$ sccm: 150 sccm; bias power, 1500 W; ICP power, 0 W; and pressure, 2.0 Pa. The second etching conditions are as follows: etching gas, $BCl_3:Cl_2=700$ sccm: 100 sccm; bias power, 750 W; ICP power, 0 W; and pressure, 2.0 Pa.

Through the above-described process, the transistor 430 of this embodiment is formed.

An insulating film may be formed over the source electrode layer 405a and the drain electrode layer 405b.

The insulating film can be formed using a material and a method similar to those of the insulating layer 413. For example, a silicon oxynitride film with a thickness of 400 nm is formed by a CVD method. A heat treatment may be performed after the insulating film is formed. For example, the heat treatment is performed at 300° C. in a nitrogen atmosphere for an hour.

Further, a planarization insulating film may be formed thereover in order to reduce surface roughness due to the transistor 430.

For example, an acrylic resin film with a thickness of 1500 nm is formed as the planarization insulating film over the insulating film. The acrylic resin film can be formed in such a manner that the top surface of the transistor 430 is coated with an acrylic resin by a coating method and then baking (e.g., at 250° C. in a nitrogen atmosphere for an hour) is performed.

A heat treatment may be performed after the planarization insulating film is formed. For example, the heat treatment is performed at 250° C. in a nitrogen atmosphere for an hour.

As described above, the first metal element contained in the glass substrate 400 can be prevented from diffusing into the second gate insulating film 402 and the oxide semiconductor film 403 because the first insulating film 436 is provided between the second gate insulating film 402 and the oxide semiconductor film 403, and the glass substrate 400.

Diffusion of the first metal element contained in the glass substrate 400, which might cause variation or decrease in electric characteristics of the transistor 430, can be prevented; therefore, the electric characteristics of the transistor 430 can be stabilized.

Consequently, a highly reliable semiconductor device which includes the transistor 430 including the oxide semiconductor film 403 and having stable electric characteristics can be provided. Further, the highly reliable semiconductor device can be manufactured at high yield, whereby high productivity can be achieved.

Embodiment 3

In this embodiment, another embodiment of a semiconductor device and a method for manufacturing the semiconductor device will be described with reference to FIGS. 4A and 4B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 4A:
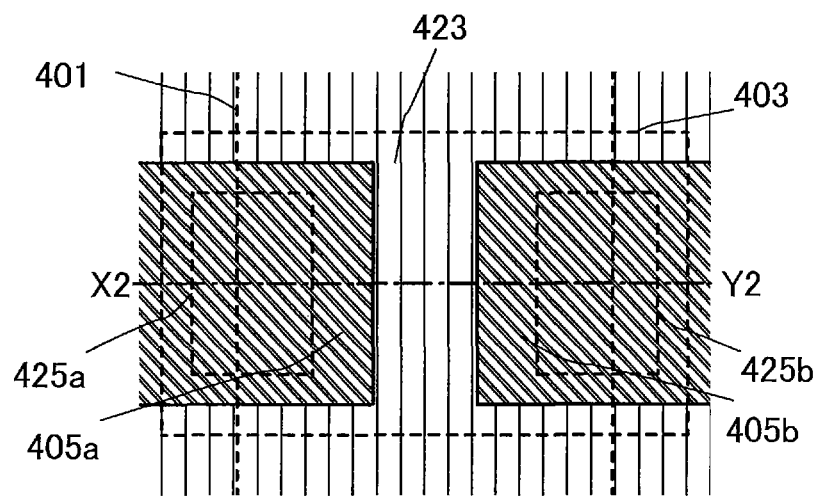
FIGS. 4A and 4B are a plan view and a cross-sectional view illustrating one embodiment of a semiconductor device.
Figure 4B:
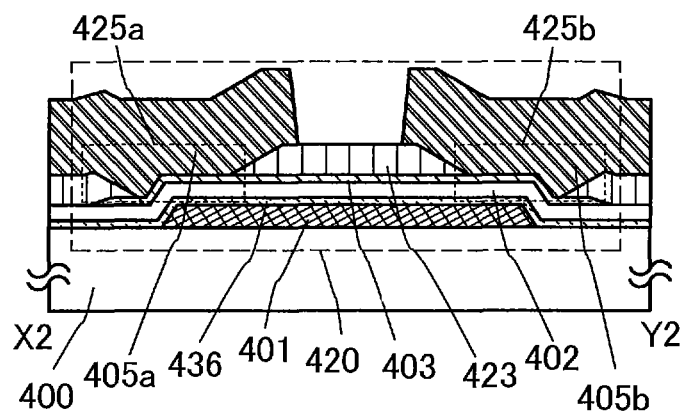

A transistor 420 illustrated in FIGS. 4A and 4B is an example of a transistor which is a kind of bottom-gate transistor referred to as a channel-protective transistor (also referred to as a channel-stop transistor) and is also referred to as an inverted-staggered transistor. FIG. 4A is a plan view, and FIG. 4B is a cross-sectional view taken along the chain line X2-Y2 in FIG. 4A.

As illustrated in FIG. 4B which is the cross-sectional view of the transistor 420 in a channel length direction, a semiconductor device including the transistor 420 includes, over the glass substrate 400, the gate electrode layer 401 and the first gate insulating film 436 which is provided so as to cover the gate electrode layer 401; and the second gate insulating film 402, the oxide semiconductor film 403, an insulating layer 423, the source electrode layer 405a, and the drain electrode layer 405b which are provided over the first gate insulating film 436.

The insulating layer 423 includes openings 425a and 425b which reach the oxide semiconductor film 403 and whose inner walls are each covered with the source electrode layer 405a or the drain electrode layer 405b. Accordingly, the insulating layer 423 covers the periphery of the oxide semiconductor film 403 and thus functions also as an interlayer insulating film. Parasitic capacitance can be reduced by locating, in addition to the second gate insulating film 402, the insulating layer 423 as an interlayer insulating film at the intersection of a gate wiring and a source wiring.

In the transistor 420, the oxide semiconductor film 403 is covered with the insulating layer 423, the source electrode layer 405a, and the drain electrode layer 405b.

The insulating layer 423 can be formed by etching an insulating film which is formed by a plasma-enhanced CVD method or a sputtering method. Inner walls of the openings 425a and 425b in the insulating layer 423 are tapered.

The insulating layer 423 is provided over a region of the oxide semiconductor film 403 including at least the channel formation region, which overlaps with the gate electrode layer 401, and partly functions as a channel protective film.

The first gate insulating film 436 and the second gate insulating film 402 are at least provided between the gate electrode layer 401 and the oxide semiconductor film 403. The first gate insulating film 436 provided on the gate electrode layer 401 side and the second gate insulating film 402 provided on the oxide semiconductor film 403 side have different compositions. In addition, a first metal element contained in the glass substrate 400 has a concentration lower than or equal to $5 \times 10^{18}$ atoms/cm$^3$ (preferably, lower than or equal to $1 \times 10^{18}$ atoms/cm$^3$) at the interface between the first gate insulating film 402.

The first gate insulating film 436 can be formed using a thin nitride insulating film. For example, a silicon nitride film and a silicon nitride oxide film can be given. The first gate insulating film 436 may have a single-layer structure or a layered structure. The thickness of the first gate insulating film 436, which is small, can be made larger than or equal to 30 nm and smaller than or equal to 50 nm.

As the first gate insulating film 436 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, and a barium oxide film) or a metal nitride insulating film containing any one of these metal elements as its component (e.g., an aluminum nitride film or an aluminum nitride oxide film). Alternatively, as the first gate insulating film 436, a gallium oxide film, an In—Zr—Zn-based oxide film, an In—Fe—Zn-based oxide film, an In—Ce—Zn-based oxide film, or the like can be used.

In either case, as the metal element which should be reduced so as not to reduce the reliability (stability in characteristics) of the transistor 420, there are sodium, aluminum, magnesium, calcium, strontium, and barium. Other elements contained in the glass substrate 400, such as silicon and boron, are preferably reduced to a degree equivalent to those of the above metal elements.

As described above, the first metal element contained in the glass substrate 400 can be prevented from diffusing into the second gate insulating film 402 and the oxide semiconductor film 403 because the first insulating film 436 is provided between the second gate insulating film 402 and the oxide semiconductor film 403, and the glass substrate 400.

Diffusion of the first metal element contained in the glass substrate 400, which might cause variation or decrease in electric characteristics of the transistor 420, can be prevented; therefore, the electric characteristics of the transistor 420 can be stabilized.

Consequently, a highly reliable semiconductor device which includes the transistor 420 including the oxide semiconductor film 403 and having stable electric characteristics can be provided. Further, the highly reliable semiconductor device can be manufactured at high yield, whereby high productivity can be achieved.

Embodiment 4

In this embodiment, another embodiment of a semiconductor device and a method for manufacturing the semiconductor device will be described with reference to FIGS. 11A and 11B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 11A:
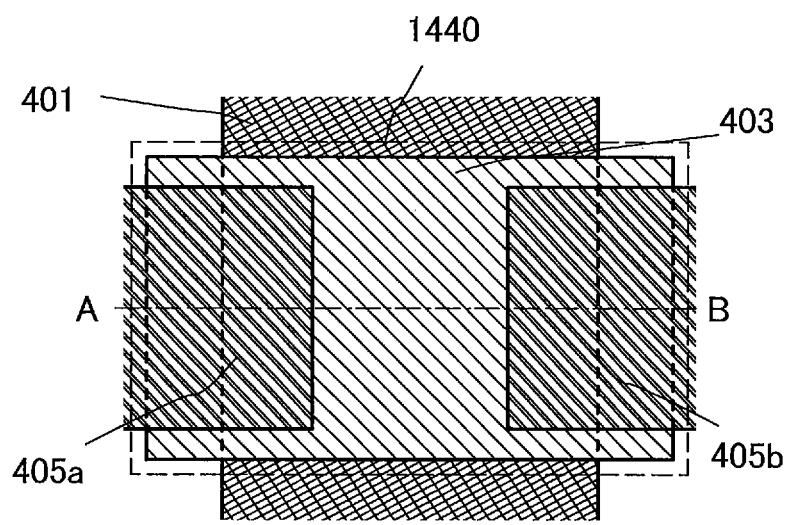
FIGS. 11A and 11B are a plan view and a cross-sectional view illustrating one embodiment of a semiconductor device.
Figure 11B:
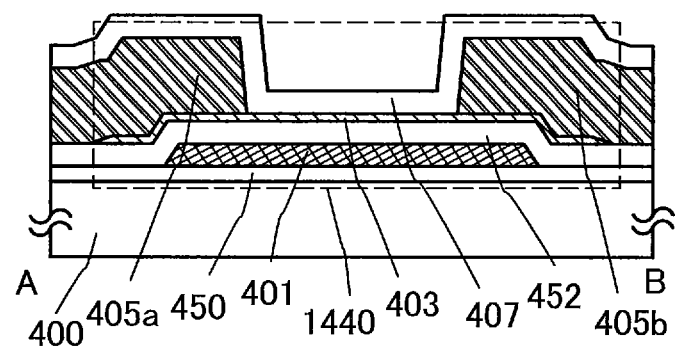

A transistor 1440 illustrated in FIGS. 11A and 11B is an example of a transistor which is a kind of bottom-gate transistor and is also referred to as an inverted-staggered transistor. FIG. 11A is a plan view, and FIG. 11B is a cross-sectional view taken along the chain line A-B in FIG. 11A.

As illustrated in FIG. 11B which is the cross-sectional view of the transistor 1440 in a channel length direction, a semiconductor device including the transistor 1440 includes a protective insulating film 450 provided over a glass substrate 400; and the gate electrode layer 401, a gate insulating film 452, the oxide semiconductor film 403, the source electrode layer 405a, and the drain electrode layer 405b which are provided over the protective insulating film 450. Further, a insulating film 407 covering the transistor 1440 is provided.

The protective insulating film 450 is provided between the glass substrate 400 and the gate electrode layer 401, so that a second metal element contained in the glass substrate 400 has a concentration lower than or equal to $5 \times 10^{18}$ atoms/cm$^3$ (preferably, lower than or equal to $1 \times 10^{18}$ atoms/cm$^3$) at the interface between the gate electrode layer 401 and the gate insulating film 452. Note that the second metal element contained in the glass substrate 400 is an element which is other than main constituent elements of the gate electrode layer 401 and the gate insulating film 452 and is diffused from the glass substrate 400.

Note that the concentration of the second metal element contained in the glass substrate 400 is measured by secondary ion mass spectrometry (SIMS).

The following can be given as examples of the second metal element contained in the glass substrate 400. For example, in the case where the glass substrate 400 is soda-lime glass, sodium, calcium, and the like can be given as a metal element because the components of the soda-lime glass are silicon oxide ($SiO_2$), sodium carbonate ($Na_2CO_3$), and calcium carbonate ($CaCo_3$). In addition, in the case where the glass substrate 400 is a kind of non-alkali glass (glass without soda) which is used for a display panel such as a liquid crystal display panel, its components are $SiO_2$, $Al_2O_3$, $B_2O_3$, and RO (R denotes a bivalent metal element such as magnesium, calcium, strontium, or barium); therefore, aluminum, magnesium, calcium, strontium, and barium can be considered as a metal element.

In either case, as the metal element which should be reduced so as not to reduce the reliability (stability in characteristics) of the transistor, there are sodium, aluminum, magnesium, calcium, strontium, and barium. Other elements contained in the glass substrate, such as silicon and boron, are preferably reduced to a degree equivalent to those of the above metal elements.

The protective insulating film 450 can be formed using a nitride insulating film. For example, a silicon nitride film and a silicon nitride oxide film can be given. Further, the protective insulating film 450 may have a single-layer structure or a layered structure.

As the protective insulating film 450 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the protective insulating film 450, a gallium oxide film, an In—Zr—Zn-based oxide film, an In—Fe—Zn-based oxide film, an In—Ce—Zn-based oxide film, or the like can be used.

As the protective insulating film 450, another oxide insulating film may be stacked in addition to the metal oxide insulating film or the metal nitride insulating film. For example, a silicon nitride film and a silicon oxynitride film may be stacked on the glass substrate 400 side as the protective insulating film 450.

The second metal element contained in the glass substrate 400 can be prevented from diffusing into the transistor 1440 because the protective insulating film 450 is provided between the transistor 1440 and the glass substrate 400.

When a dense insulating film such as a silicon nitride film is provided as the protective insulating film 450, movable ions of sodium or the like contained in the glass substrate 400 can be prevented from diffusing into the transistor 1440.

Diffusion of the second metal element contained in the glass substrate, which might cause variation or decrease in electric characteristics of the transistor 1440, can be prevented; therefore, the electric characteristics of the transistor 1440 can be stabilized.

When such a metal element exists in the periphery of the gate electrode layer, defects generate in the gate insulating film or the interface between the gate electrode layer and the gate insulating film, and trap of electric charges in such defects likely to cause variation in electric characteristics of the transistor. For example, it is concerned that, when positive electric charges are trapped in the periphery of the gate electrode layer, the electric characteristics of the transistor might be shifted in the direction of normally-on. Further, when movable ions of sodium or the like are contained in the gate insulating film and positive bias is applied to the gate electrode layer, the positive movable ions transfer to the interface between the gate insulating film and the oxide semiconductor film, which cause electric characteristics of the transistor to shift in the direction of normally-on. Thus, in order to stabilize the electric characteristics of the transistor, it is effective to prevent such a metal element that causes adverse effect from penetrating to the gate insulating film side from the glass substrate.

Consequently, a highly reliable semiconductor device which includes the transistor 1440 including the oxide semiconductor film 403 and having stable electric characteristics can be provided.

FIGS. 12A to 12E illustrate an example of a method for manufacturing a semiconductor device including the transistor 1440.

There is no particular limitation on a substrate that can be used as the glass substrate 400 as long as it has heat resistance enough to withstand a heat treatment performed later. For example, a barium borosilicate glass substrate, an aluminoborosilicate glass substrate, or the like can be used.

Figure 12A:
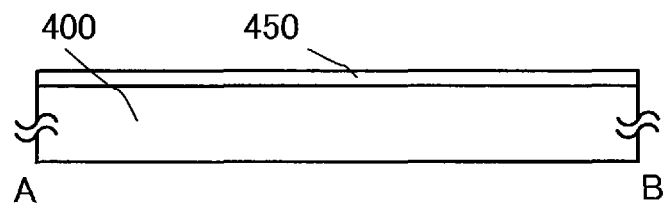
FIGS. 12A to 12E are cross-sectional views illustrating one embodiment of a method for manufacturing a semiconductor device.

As a base film, the protective insulating film 450 is provided so as to cover the glass substrate 400 (see FIG. 12A).

The protective insulating film 450 can be formed using a nitride insulating film formed by a plasma-enhanced CVD method, a sputtering method, or the like. For example, a silicon nitride film and a silicon nitride oxide film can be given. The protective insulating film 450 may have a single-layer structure or a layered structure.

In this embodiment, as the protective insulating film 450, a stack of a silicon nitride film with a thickness of 100 nm and a silicon oxide film with a thickness of 150 nm which are formed by a plasma-enhanced CVD method is used.

The glass substrate 400, or the glass substrate 400 and the protective insulating film 450 may be subjected to a heat treatment. For example, the heat treatment can be performed at 650° C. for 1 minute to 5 minutes with a gas rapid thermal annealing (GRTA) apparatus which performs a heat treatment using a high-temperature gas. As the high-temperature gas in the GRTA apparatus, an inert gas which does not react by a heat treatment with an object to be processed, such as nitrogen or a rare gas like argon, is used. Alternatively, the heat treatment may be performed at 500° C. for 30 minutes to an hour with an electric furnace.

Figure 12B:
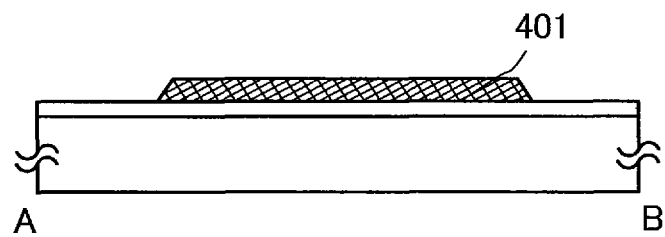

Next, a conductive film is formed over the protective insulating film 450 and is etched into the gate electrode layer 401 (see FIG. 12B). Note that the conductive film may be etched using either dry etching or wet etching, or using both dry etching and wet etching.

In this embodiment, as the conductive film, a tungsten film with a thickness of 100 nm is formed by a sputtering method.

The glass substrate 400 is not exposed in the etching step for forming the gate electrode layer 401 because the glass substrate 400 is covered with the protective insulating film 450. Thus, attachment of the second metal element contained in the glass substrate 400 to the surface of the gate electrode layer 401 can be prevented.

The glass substrate 400, the protective insulating film 450, and the gate electrode layer 401 may be subjected to a heat treatment after the gate electrode layer 401 is formed. For example, the heat treatment can be performed at 650° C. for 1 minute to 5 minutes with a GRTA apparatus. Alternatively, the heat treatment may be performed at 500° C. for 30 minutes to an hour with an electric furnace.

Next, the gate insulating film 452 is formed over the gate electrode layer 401.

To improve the coverage with the gate insulating film 452, a planarization treatment may be performed on the surface of the gate electrode layer 401. It is preferable that the flatness of the surface of the gate electrode layer 401 be favorable particularly when a thin insulating film is used for the gate insulating film 452.

The gate insulating film 452 has a thickness larger than or equal to 1 nm and smaller than or equal to 20 nm and can be formed by a sputtering method, a MBE method, a CVD method, a pulse laser deposition method, an ALD method, or the like as appropriate. Alternatively, the gate insulating film 452 may be formed with a sputtering apparatus where deposition is performed with surfaces of a plurality of substrates set substantially perpendicular to a surface of a sputtering target.

The gate insulating film 452 can be formed using a silicon oxide film, a gallium oxide film, an aluminum oxide film, a silicon nitride film, a silicon oxynitride film, an aluminum oxynitride film, or a silicon nitride oxide film.

The gate insulating film 452 can be formed using a high-k material such as a hafnium oxide film, a yttrium oxide film, a hafnium silicate film (HfSi$_x$O$_y$ (x>0, y>0)), a hafnium silicate film (HfSiO$_x$N$_y$ (x>0, y>0)) to which nitrogen is added, a hafnium aluminate film (HfAl$_x$O$_y$ (x>0, y>0)), or a lanthanum oxide film, whereby gate leakage current can be reduced. Further, the gate insulating film 452 may have either a single-layer structure or a layered structure.

It is preferable that the gate insulating film 452 include oxygen in a portion which is in contact with the oxide semiconductor film 403. In particular, the gate insulating film 452 preferably contains, in the film (bulk), oxygen whose content is in excess of the oxygen content in the stoichiometric composition. For example, in the case where a silicon oxide film is used as the gate insulating film 452, the composition formula is $SiO_{2+\alpha}(\alpha>0)$.

The gate insulating film 452 including much (excessive) oxygen, which serves as an oxygen supply source, can be provided so as to be in contact with the oxide semiconductor film 403, whereby oxygen can be supplied to the oxide semiconductor film 403 from the gate insulating film 452. Alternatively, a heat treatment may be performed in the state where the oxide semiconductor film 403 and the gate insulating film 452 are at least partly in contact with each other to supply oxygen to the oxide semiconductor film 403.

By supply of oxygen to the oxide semiconductor film 403, oxygen vacancies in the film can be repaired. Further, the gate insulating film 452 is preferably formed in consideration of the size of a transistor to be formed and the step coverage with the gate insulating film 452.

In this embodiment, a silicon oxynitride film with a thickness of 200 nm is formed by a high-density plasma-enhanced CVD method.

Moreover, the glass substrate 400, the gate electrode layer 401, and the gate insulating film 452 may be subjected to a heat treatment after the gate insulating film 452 is formed. For example, the heat treatment can be performed at 650° C. for 1 minute to 5 minutes with a GRTA apparatus. Alternatively, the heat treatment may be performed at 500° C. for 30 minutes to an hour with an electric furnace.

Figure 12C:
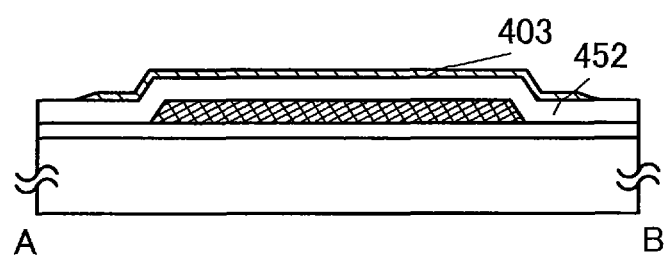

Next, the oxide semiconductor film 403 is formed over the gate insulating film 452 (see FIG. 12C).

A planarization treatment may be performed on the region of the gate insulating film 452 which is in contact with the oxide semiconductor film 403. As the planarization treatment, a polishing treatment (e.g., a chemical mechanical polishing (CMP) method), a dry etching treatment, or a plasma treatment can be used, though there is no particular limitation on the planarization treatment.

As the planarization treatment, a polishing treatment, a dry etching treatment, or a plasma treatment may be performed plural times, or these treatments may be performed in combination. In the case where the treatments are combined, the order of steps is not particularly limited and may be set as appropriate depending on the roughness of the surface of the gate insulating film 452.

Note that in this embodiment, as the oxide semiconductor film 403, an In—Ga—Zn-based oxide film (IGZO film) with a thickness of 35 nm is formed by a sputtering method with a sputtering apparatus including an AC power supply device. In this embodiment, an In—Ga—Zn-based oxide target with an atomic ratio of In:Ga:Zn being 1:1:1 (=1/3:1/3:1/3) is used. Note that deposition conditions are as follows: atmosphere, oxygen gas and argon gas (the flow rate of oxygen: 50%); pressure, 0.6 Pa; electric power, 5 kW; and substrate temperature, 170° C. Here, the deposition rate is 16 nm/min.

It is preferable to form the gate insulating film 452 and the oxide semiconductor film 403 in succession so as not to expose the gate insulating film 452 to the air. Forming the gate insulating film 452 and the oxide semiconductor film 403 in succession so as not to expose the gate insulating film 452 to the air can prevent impurities such as hydrogen and moisture from being adsorbed onto the surface of the gate insulating film 452.

The oxide semiconductor film 403 can be formed by processing an oxide semiconductor film into an island shape by a photolithography process.

Further, a heat treatment may be performed on the oxide semiconductor film 403 in order to remove excess hydrogen (including water and a hydroxyl group) (to perform a dehydration or dehydrogenation treatment).

In this embodiment, the substrate is introduced into an electric furnace which is one of heat treatment apparatuses, and the oxide semiconductor film 403 is subjected to a heat treatment at 450° C. in a nitrogen atmosphere for an hour and then subjected to another heat treatment at 450° C. in an atmosphere containing nitrogen and oxygen for an hour.

Next, a conductive film to be the source electrode layer and the drain electrode layer (including a wiring formed in the same layer as the source electrode layer and the drain electrode layer) is formed over the gate electrode layer 401, the gate insulating film 452, and the oxide semiconductor film 403.

Figure 12D:
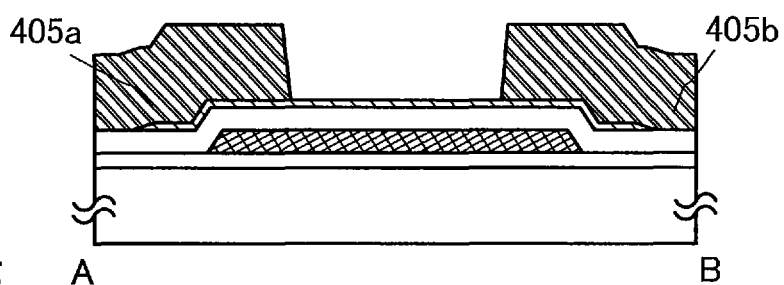

Through a photolithography process, a resist mask is formed over the conductive film, and the source electrode layer 405a and the drain electrode layer 405b are formed by selective etching (see FIG. 12D). After the source electrode layer 405a and the drain electrode layer 405b are formed, the resist mask is removed.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: etching gas, $BCl_3:Cl_2$=750 sccm: 150 sccm; bias power, 1500 W; ICP power, 0 W; and pressure, 2.0 Pa. The second etching conditions are as follows: etching gas, $BCl_3:Cl_2$=700 sccm: 100 sccm; bias power, 750 W; ICP power, 0 W; and pressure, 2.0 Pa.

Through the above-described process, the transistor 1440 of this embodiment is formed.

Figure 12E:
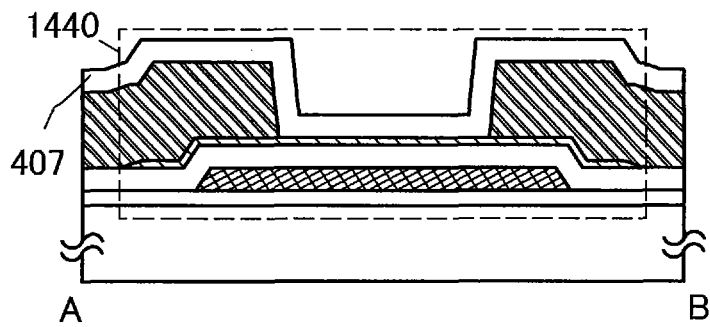

In this embodiment, the insulating film 407 is formed over the source electrode layer 405a and the drain electrode layer 405b and in contact with the oxide semiconductor film 403 (see FIG. 12E).

In this embodiment, as the insulating film 407, a silicon oxide film with a thickness of 300 nm is formed by a sputtering method.

Next, the oxide semiconductor film 403 part of which (a channel formation region) is in contact with the insulating film 407 is subjected to a heating step.

For the heating step, a heating method and a heating apparatus similar to those for the heating step where a dehydration or dehydrogenation treatment is performed can be employed.

The oxide semiconductor film 403 and the insulating film 407 containing oxygen are in contact with each other when being subjected to the heating step; thus, oxygen that is one of the main components of the oxide semiconductor film 403 and that is reduced by the step for removing an impurity can be supplied from the insulating film 407 containing oxygen to the oxide semiconductor film 403.

Alternatively, a dense inorganic insulating film may be provided over the insulating film 407. For example, an aluminum oxide film is formed over the insulating film 407 by a sputtering method.

Further, a planarization insulating film may be formed thereover in order to reduce surface roughness due to the transistor 1440.

For example, an acrylic resin film with a thickness of 1500 nm is formed as the planarization insulating film. The acrylic resin film can be formed in such a manner that the top surface of the transistor 1440 is coated with an acrylic resin by a coating method and then baking (e.g., at 250° C. in a nitrogen atmosphere for an hour) is performed.

A heat treatment may be performed after the planarization insulating film is formed. For example, the heat treatment is performed at 250° C. in a nitrogen atmosphere for an hour.

As described above, a heat treatment may be performed after the transistor 1440 is formed. The heat treatment may be performed more than once.

The second metal element contained in the glass substrate 400 can be prevented from diffusing into the transistor 1440 because the protective insulating film 450 is provided between the transistor 1440 and the glass substrate 400.

Diffusion of the second metal element contained in the glass substrate 400, which might cause variation or decrease in electric characteristics of the transistor 1440, can be prevented; therefore, the electric characteristics of the transistor 1440 can be stabilized.

Consequently, a highly reliable semiconductor device which includes the transistor 1440 including the oxide semiconductor film 403 and having stable electric characteristics can be provided. Further, the highly reliable semiconductor device can be manufactured at high yield, whereby high productivity can be achieved.

Embodiment 5

In this embodiment, another embodiment of a semiconductor device and a method for manufacturing the semiconductor device will be described with reference to FIGS. 13A and 13B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 13A:
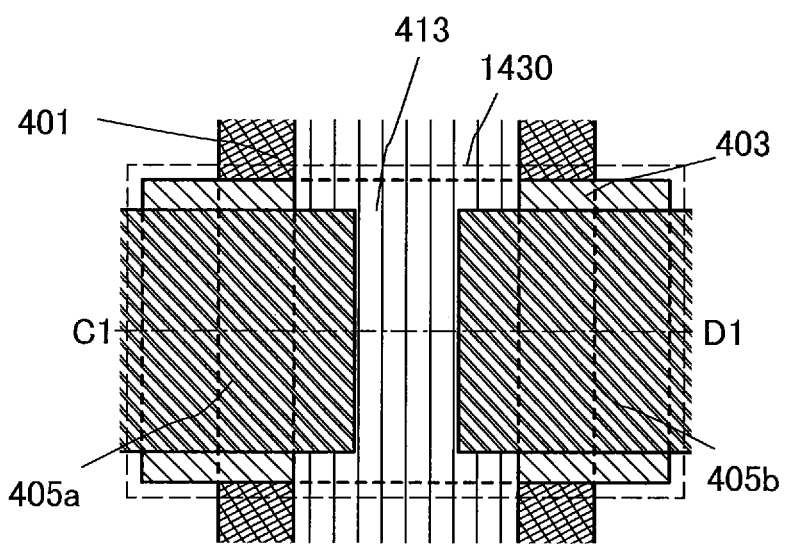
FIGS. 13A and 13B are a plan view and a cross-sectional view illustrating one embodiment of a semiconductor device.
Figure 13B:
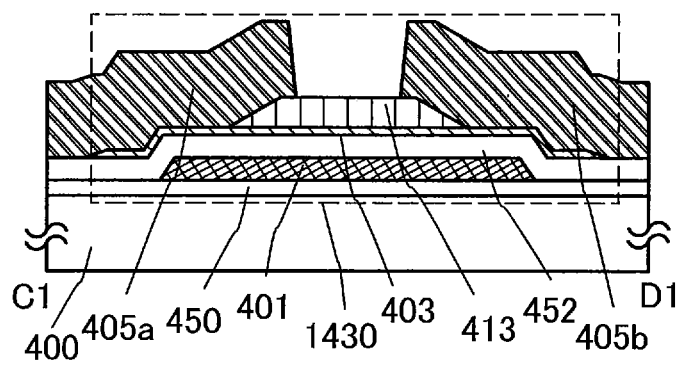

A transistor 1430 illustrated in FIGS. 13A and 13B is an example of a transistor which is a kind of bottom-gate transistor referred to as a channel-protective transistor (also referred to as a channel-stop transistor) and is also referred to as an inverted-staggered transistor. FIG. 13A is a plan view, and FIG. 13B is a cross-sectional view taken along the chain line C1-D1 in FIG. 13A.

As illustrated in FIG. 13B which is the cross-sectional view of the transistor 1430 in a channel length direction, a semiconductor device including the transistor 1430 includes, over the glass substrate 400 over which the protective insulating film 450 is provided, the gate electrode layer 401, the gate insulating film 452, the oxide semiconductor film 403, the insulating layer 413, the source electrode layer 405a, and the drain electrode layer 405b. Further, the insulating layer 413 is in contact with the oxide semiconductor film 403.

The protective insulating film 450 is provided between the glass substrate 400 and the gate electrode layer 401, so that a second metal element contained in the glass substrate 400 has a concentration lower than or equal to $5\times10^{18}$ atoms/cm$^3$ (preferably, lower than or equal to $1\times10^{18}$ atoms/cm$^3$) at the interface between the gate electrode layer 401 and the gate insulating film 452.

The protective insulating film 450 can be formed using a nitride insulating film. For example, a silicon nitride film and a silicon nitride oxide film can be given. Further, the protective insulating film 450 may have a single-layer structure or a layered structure.

As the protective insulating film 450 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the protective insulating film 450, a gallium oxide film, an In—Zr—Zn-based oxide film, an In—Fe—Zn-based oxide film, an In—Ce—Zn-based oxide film, or the like can be used.

As the protective insulating film 450, another oxide insulating film may be stacked in addition to the metal oxide insulating film or the metal nitride insulating film. For example, a silicon nitride film and a silicon oxynitride film may be stacked on the glass substrate 400 side as the protective insulating film 450.

As the metal element which should be reduced so as not to reduce the reliability (stability in characteristics) of the transistor 1430, there are sodium, aluminum, magnesium, calcium, strontium, and barium. Other elements contained in the glass substrate 400, such as silicon and boron, are preferably reduced to a degree equivalent to those of the above metal elements.

The insulating layer 413 in contact with the oxide semiconductor film 403 is provided over a channel formation region of the oxide semiconductor film 403, which overlaps with the gate electrode layer 401, and functions as a channel protective film.

An example of a method for manufacturing the semiconductor device including the transistor 1430 will be described below.

First, the protective insulating film 450 is formed over the glass substrate 400 having an insulation surface. In this embodiment, as the protective insulating film 450, a stack of a silicon nitride film with a thickness of 100 nm and a silicon oxide film with a thickness of 150 nm which are formed by a plasma-enhanced CVD method is used.

Next, a conductive film is formed over the protective insulating film 450 and is etched into the gate electrode layer 401. In this embodiment, a tungsten film with a thickness of 100 nm is formed by a sputtering method.

Next, the gate insulating film 452 is formed over the gate electrode layer 401. In this embodiment, a silicon oxynitride film with a thickness of 200 nm is formed by a high-density plasma-enhanced CVD method.

Next, the oxide semiconductor film 403 is formed over the gate insulating film 452. Note that in this embodiment, as the oxide semiconductor film 403, an In—Ga—Zn-based oxide film (IGZO film) with a thickness of 35 nm is formed by a sputtering method with a sputtering apparatus including an AC power supply device. In this embodiment, an In—Ga—Zn-based oxide target with an atomic ratio of In:Ga:Zn being 1:1:1 (=1/3:1/3:1/3) is used. Note that deposition conditions are as follows: atmosphere, oxygen gas and argon gas (the flow rate of oxygen: 50%); pressure, 0.6 Pa; electric power, 5 kW; and substrate temperature, 170° C. Here, the deposition rate is 16 nm/min.

Further, a heat treatment may be performed on the oxide semiconductor film 403 in order to remove excess hydrogen (including water and a hydroxyl group) (to perform a dehydration or dehydrogenation treatment). In this embodiment, the substrate is introduced into an electric furnace which is one of heat treatment apparatuses, and the oxide semiconductor film 403 is subjected to a heat treatment at 450° C. in a nitrogen atmosphere for an hour and then subjected to another heat treatment at 450° C. in an atmosphere containing nitrogen and oxygen for an hour.

Next, the insulating layer 413 is formed over the channel formation region of the oxide semiconductor film 403, which overlaps with the gate electrode layer 401.

In this embodiment, as the insulating layer 413, a silicon oxide film with a thickness of 200 nm is formed by a sputtering method. The silicon oxide film is selectively etched to form the insulating layer 413 having a trapezoidal or triangular cross-sectional shape whose taper angle at the lower end portion is less than or equal to 60°, preferably less than or equal to 45°, further preferably less than or equal to 30°. The planar shape of the insulating layer 413 is a rectangle. In this embodiment, a resist mask is formed over the silicon oxide film through a photolithography process, and selective etching is performed to form a taper with an angle of about 30° at the lower end portion of the insulating layer 413.

A heat treatment may be performed after the insulating layer 413 is formed. In this embodiment, the heat treatment is performed at 300° C. in a nitrogen atmosphere for an hour.

Next, a conductive film to be the source electrode layer and the drain electrode layer is formed over the gate electrode layer 401, the gate insulating film 452, the oxide semiconductor film 403, and the insulating layer 413.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: etching gas, $BCl_3:Cl_2=750$ sccm: 150 sccm; bias power, 1500 W; ICP power, 0 W; and pressure, 2.0 Pa. The second etching conditions are as follows: etching gas, $BCl_3:Cl_2=700$ sccm: 100 sccm; bias power, 750 W; ICP power, 0 W; and pressure, 2.0 Pa.

Through the above-described process, the transistor 1430 of this embodiment is formed.

An insulating film may be formed over the source electrode layer 405a and the drain electrode layer 405b.

The insulating film can be formed using a material and a method similar to those of the insulating layer 413. For example, a silicon oxynitride film with a thickness of 400 nm is formed by a CVD method. A heat treatment may be performed after the insulating film is formed. For example, the heat treatment is performed at 300° C. in a nitrogen atmosphere for an hour.

Further, a planarization insulating film may be formed thereover in order to reduce surface roughness due to the transistor 1430.

For example, an acrylic resin film with a thickness of 1500 nm is formed as the planarization insulating film over the insulating film. The acrylic resin film can be formed in such a manner that the top surface of the transistor 1430 is coated with an acrylic resin by a coating method and then baking (e.g., at 250° C. in a nitrogen atmosphere for an hour) is performed.

A heat treatment may be performed after the planarization insulating film is formed. For example, the heat treatment is performed at 250° C. in a nitrogen atmosphere for an hour.

As described above, the second metal element contained in the glass substrate 400 can be prevented from diffusing into the transistor 1430 because the protective insulating film 450 is provided between the transistor 1430 and the glass substrate 400.

Diffusion of the second metal element contained in the glass substrate, which might cause variation or decrease in electric characteristics of the transistor 1430, can be prevented; therefore, the electric characteristics of the transistor 1430 can be stabilized.

Consequently, a highly reliable semiconductor device which includes the transistor 1430 including the oxide semiconductor film 403 and having stable electric characteristics can be provided. Further, the highly reliable semiconductor device can be manufactured at high yield, whereby high productivity can be achieved.

Embodiment 6

In this embodiment, another embodiment of a semiconductor device and a method for manufacturing the semiconductor device will be described with reference to FIGS. 14A and 14B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 14A:
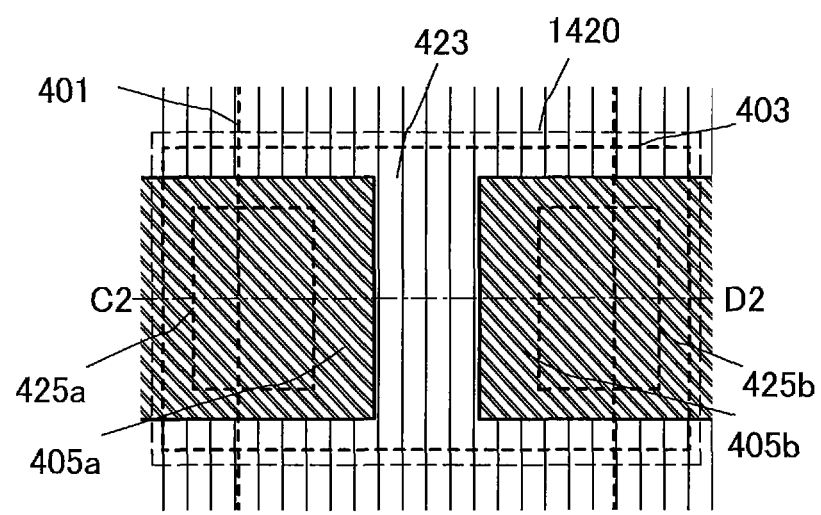
FIGS. 14A and 14B are a plan view and a cross-sectional view illustrating one embodiment of a semiconductor device.
Figure 14B:
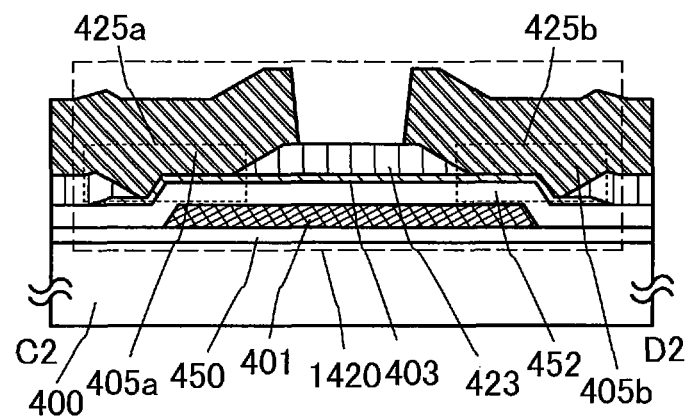

A transistor 1420 illustrated in FIGS. 14A and 14B is an example of a transistor which is a kind of bottom-gate transistor referred to as a channel-protective transistor (also referred to as a channel-stop transistor) and is also referred to as an inverted-staggered transistor. FIG. 14A is a plan view, and FIG. 14B is a cross-sectional view taken along the chain line C2-D2 in FIG. 14A.

As illustrated in FIG. 14B which is the cross-sectional view of the transistor 1420 in a channel length direction, a semiconductor device including the transistor 1420 includes, over the glass substrate 400 over which the protective insulating film 450 is provided, the gate electrode layer 401, the gate insulating film 452, the oxide semiconductor film 403, the insulating layer 423, the source electrode layer 405a, and the drain electrode layer 405b.

The insulating layer 423 is provided over a region of the oxide semiconductor film 403 including at least the channel formation region of the oxide semiconductor film 403, which overlaps with the gate electrode layer 401, and functions as a channel protective film. The insulating layer 423 includes openings 425a and 425b which reach the oxide semiconductor film 403 and whose inner walls are each covered with the source electrode layer 405a or the drain electrode layer 405b. Accordingly, the insulating layer 423 covers the periphery of the oxide semiconductor film 403 and thus functions also as an interlayer insulating film. Parasitic capacitance can be reduced by locating, in addition to the gate insulating film 452, the insulating layer 423 as an interlayer insulating film at the intersection of a gate wiring and a source wiring.

In the transistor 1420, the oxide semiconductor film 403 is covered with the insulating layer 423, the source electrode layer 405a, and the drain electrode layer 405b.

The insulating layer 423 can be formed by etching an insulating film which is formed by a plasma-enhanced CVD method or a sputtering method. Inner walls of the openings 425a and 425b in the insulating layer 423 are tapered.

The insulating layer 423 is provided over a region of the oxide semiconductor film 403 including at least the channel formation region of the oxide semiconductor film 403, which overlaps with the gate electrode layer 401, and partly functions as a channel protective film.

The protective insulating film 450 is provided between the glass substrate 400 and the gate electrode layer 401, so that a second metal element contained in the glass substrate 400 has a concentration lower than or equal to $5\times10^{18}$ atoms/cm$^3$ (preferably, lower than or equal to $1\times10^{18}$ atoms/cm$^3$) at the interface between the gate electrode layer 401 and the gate insulating film 452.

The protective insulating film 450 can be formed using a nitride insulating film. For example, a silicon nitride film and a silicon nitride oxide film can be given. Further, the protective insulating film 450 may have a single-layer structure or a layered structure.

As the protective insulating film 450 for preventing impurity diffusion from the glass substrate 400, it is possible to use, for example, a metal oxide insulating film containing one or more selected from metal elements such as titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the protective insulating film 450, a gallium oxide film, an In—Zr—Zn-based oxide film, an In—Fe—Zn-based oxide film, an In—Ce—Zn-based oxide film, or the like can be used.

As the protective insulating film 450, another oxide insulating film may be stacked in addition to the metal oxide insulating film or the metal nitride insulating film. For example, a silicon nitride film and a silicon oxynitride film may be stacked on the glass substrate 400 side as the protective insulating film 450.

As the metal element which should be reduced so as not to reduce the reliability (stability in characteristics) of the transistor 1420, there are sodium, aluminum, magnesium, calcium, strontium, and barium. Other elements contained in the glass substrate 400, such as silicon and boron, are preferably reduced to a degree equivalent to those of the above metal elements.

As described above, the second metal element contained in the glass substrate 400 can be prevented from diffusing into the transistor 1420 because the protective insulating film 450 is provided between the transistor 1420 and the glass substrate 400.

Diffusion of the second metal element contained in the glass substrate, which might cause variation or decrease in electric characteristics of the transistor 1420, can be prevented; therefore, the electric characteristics of the transistor 1420 can be stabilized.

Consequently, a highly reliable semiconductor device which includes the transistor 1420 including the oxide semiconductor film 403 and having stable electric characteristics can be provided. Further, the highly reliable semiconductor device can be manufactured at high yield, whereby high productivity can be achieved.

Embodiment 7

A semiconductor device (also referred to as a display device) with a display function can be manufactured using the transistor described in any of Embodiments 1 to 6. Moreover, part or all of the driver circuit which includes the transistor can be formed over a substrate where a pixel portion is formed, whereby a system-on-panel can be formed.

Figure 5A:
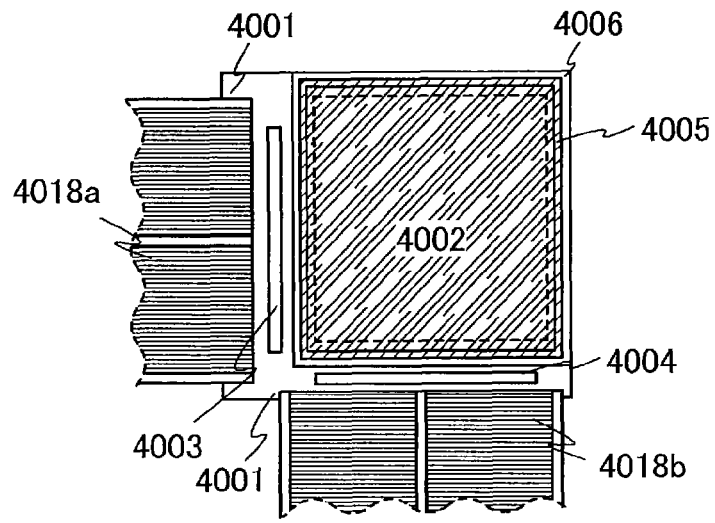
FIGS. 5A to 5C are plan views each illustrating one embodiment of a semiconductor device.

In FIG. 5A, a sealant 4005 is provided so as to surround a pixel portion 4002 provided over a glass substrate 4001, and the pixel portion 4002 is sealed with a substrate 4006. In FIG. 5A, a scan line driver circuit 4004 and a signal line driver circuit 4003 which are each formed using a single crystal semiconductor film or a polycrystalline semiconductor film over an IC chip or a substrate separately prepared are mounted on the glass substrate 4001, in a region that is different from the region surrounded by the sealant 4005. A variety of signals and potentials are supplied to the signal line driver circuit 4003 and the scan line driver circuit 4004 which are separately formed and the pixel portion 4002 from flexible printed circuits (FPCs) 4018a and 4018b.

Figure 5B:
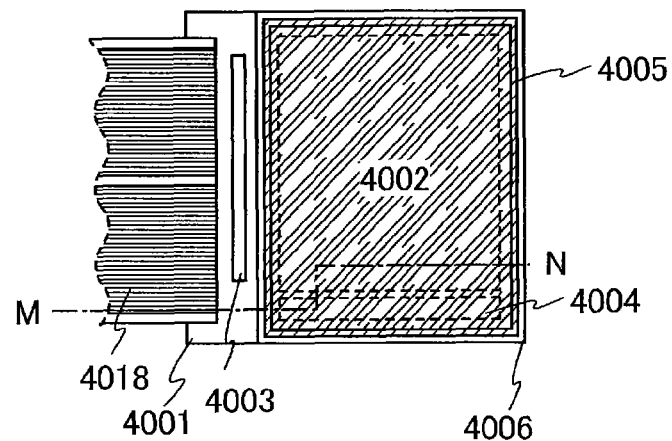
Figure 5C:
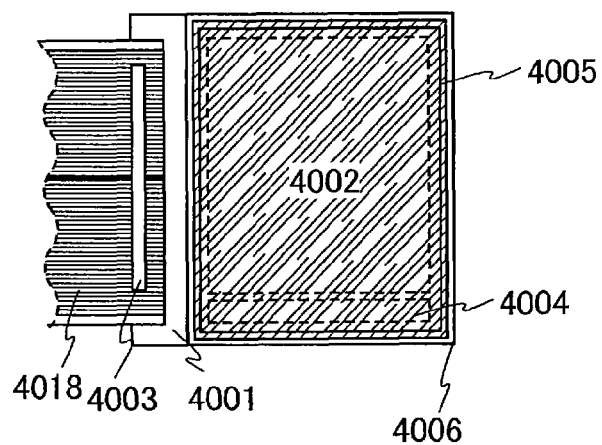

In FIGS. 5B and 5C, the sealant 4005 is provided so as to surround the pixel portion 4002 and the scan line driver circuit 4004 which are provided over the glass substrate 4001. The substrate 4006 is provided over the pixel portion 4002 and the scan line driver circuit 4004. Consequently, the pixel portion 4002 and the scan line driver circuit 4004 are sealed together with a display element, by the glass substrate 4001, the sealant 4005, and the substrate 4006. In FIGS. 5B and 5C, the signal line driver circuit 4003 which is formed using a single crystal semiconductor film or a polycrystalline semiconductor film over an IC chip or a substrate separately prepared is mounted on the glass substrate 4001, in a region that is different from the region surrounded by the sealant 4005. In FIGS. 5B and 5C, a variety of signals and potentials are supplied to the scan line driver circuit 4004 or the pixel portion 4002, and the signal line driver circuit 4003 which is separately formed from an FPC 4018.

Although FIGS. 5B and 5C each illustrate an example in which the signal line driver circuit 4003 is formed separately and mounted on the glass substrate 4001, one embodiment of the present invention is not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 5A illustrates an example in which the signal line driver circuit 4003 and the scan line driver circuit 4004 are mounted by a COG method; FIG. 5B illustrates an example in which the signal line driver circuit 4003 is mounted by a COG method; and FIG. 5C illustrates an example in which the signal line driver circuit 4003 is mounted by a TAB method.

The display device includes in its category a panel in which a display element is sealed, and a module in which an IC including a controller or the like is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the glass substrate include a plurality of transistors and transistors described in any of Embodiments 1 to 6 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

One embodiment of a semiconductor device is described with reference to FIGS. 7A and 7B and FIGS. 16A and 16B. FIGS. 7A and 7B and FIGS. 16A and 16B are cross-sectional views taken along the line M-N of FIG. 5B.

As illustrated in FIGS. 7A and 7B and FIGS. 16A and 16B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as a source electrode layer and a drain electrode layer of a transistor 4010, a transistor 4011, a transistor 4040, and a transistor 4041.

Each of the pixel portion 4002 and the scan line driver circuit 4004 which are provided over the glass substrate 4001 includes a plurality of transistors. In FIGS. 7A and 7B and FIGS. 16A and 16B, the transistor 4010 or 4040 included in the pixel portion 4002 and the transistor 4011 or 4041 included in the scan line driver circuit 4004 are illustrated as an example. An insulating film 4020 is provided over the transistors 4010 and 4011 in FIG. 7A and over the transistors 4040 and 4041 FIG. 16A, and an insulating film 4021 is further provided in FIG. 7B and FIG. 16B.

Any of the transistors described in Embodiments 1 to 6 can be applied to the transistors 4010, 4011, 4040, and 4041. In this embodiment, an example in which a transistor having a structure similar to that of the transistor 430 described in Embodiment 2 is used as each of the transistors 4010 and 4011, and a transistor having a structure similar to that of the transistor 1430 described in Embodiment 5 is used as each of the transistors 4040 and 4041 is described. The transistors 4010, 4011, 4040, and 4041 are staggered transistors having a bottom-gate structure, in each of which an insulating layer functioning as a channel protective film is provided over an oxide semiconductor film.

Gate electrode layers of the transistors 4010 and 4011 are covered with a first gate insulating film 4023, and a second gate insulating film and an oxide semiconductor film of the transistors 4010 and 4011 are protected from contamination caused by a first metal element contained in the glass substrate 4001. Thus, the first metal element contained in the glass substrate 4001 has a concentration lower than or equal to $5\times10^{18}$ atoms/cm$^3$ (preferably, lower than or equal to $1\times10^{18}$ atoms/cm$^3$) at the interface between the first gate insulating film 4023 and the second gate insulating film of the transistors 4010 and 4011.

The first gate insulating film 4023 can be formed using a thin nitride insulating film. For example, a silicon nitride film and a silicon nitride oxide film can be given. The thickness of the first gate insulating film 4023, which is small, can be made larger than or equal to 30 nm and smaller than or equal to 50 nm. The first gate insulating film 4023 may have a single-layer structure or a layered structure. In this embodiment, as the first gate insulating film 4023, a silicon nitride film is used.

Figure 16A:
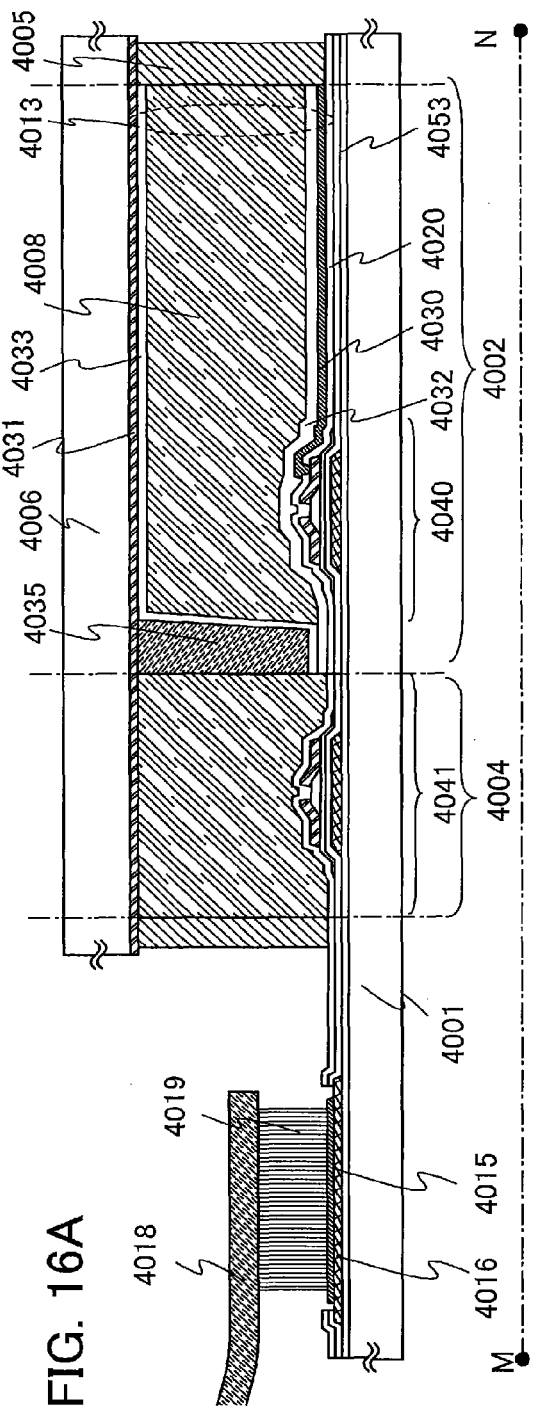
FIGS. 16A and 16B are cross-sectional views each illustrating one embodiment of a semiconductor device.
Figure 16B:
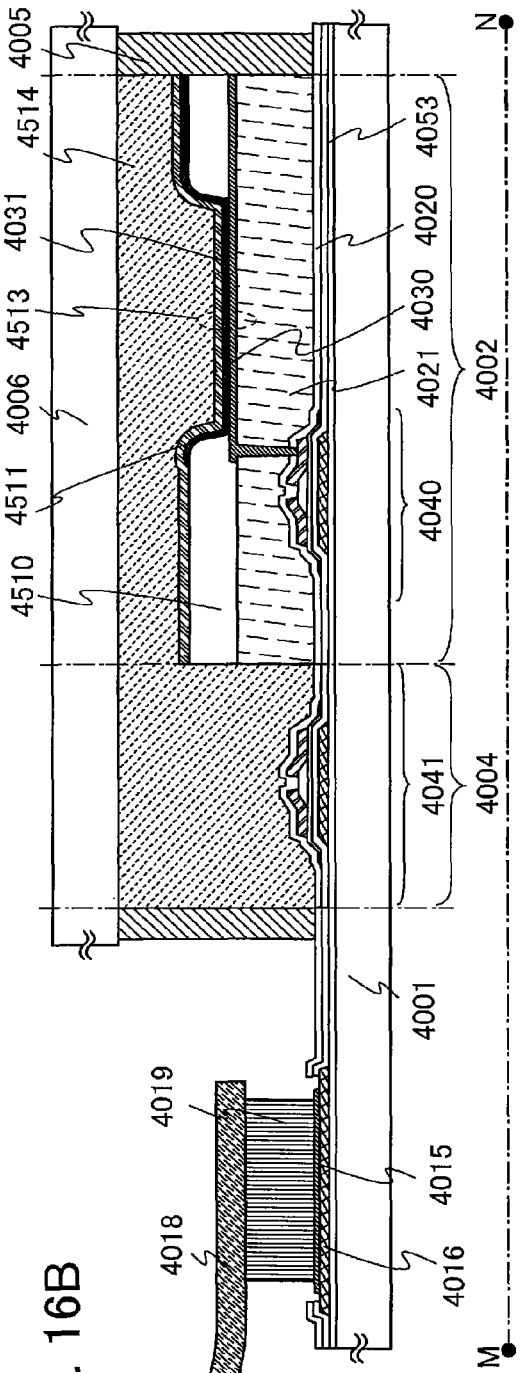

In the semiconductor device illustrated in FIGS. 16A and 16B, a protective insulating film 4053 is provided between the glass substrate 4001 and the transistors 4040 and 4041. The protective insulating film 4053 is an insulating film functioning as a base film. The protective insulating film 4053 can be formed using a nitride insulating film. For example, a silicon nitride film and a silicon nitride oxide film can be given. The protective insulating film 4053 may have a single-layer structure or a layered structure. In this embodiment, as the protective insulating film 4053, a silicon nitride film is used.

The transistors 4040 and 4041 are provided over the glass substrate 4001 covered with the protective insulating film 4053 and are protected from contamination caused by a second metal element contained in the glass substrate 4001. Thus, the second metal element contained in the glass substrate 4001 has a concentration lower than or equal to $5\times10^{18}$ atoms/cm$^3$ (preferably, lower than or equal to $1\times10^{18}$ atoms/cm$^3$) at the interfaces between a gate insulating film and gate electrode layers of the transistors 4040 and 4041.

Consequently, highly reliable semiconductor devices can be provided as semiconductor devices which include the transistors 4010 and 4011 or the transistors 4040 and 4041 each including the oxide semiconductor film and having stable electric characteristics, which are illustrated in FIGS. 7A and 7B and FIGS. 16A and 16B in this embodiment. Further, the highly reliable semiconductor device can be manufactured at high yield, whereby high productivity can be achieved.

A conductive layer may be further provided so as to overlap with the channel formation region in the oxide semiconductor film of each of the transistors 4011 and 4041 for the driver circuit. By providing the conductive layer so as to overlap with the channel formation region in the oxide semiconductor film, the amount of change in the threshold voltage of each of the transistors 4011 and 4041 between before and after a bias-temperature stress test (BT test) can be further reduced. The conductive layer may have a potential the same as or a potential different from that of the gate electrode layer of each of the transistors 4011 and 4041, and can function as a second gate electrode layer. The potential of the conductive layer may be GND or 0 V, or the conductive layer may be in a floating state.

The conductive layer also has a function of blocking an external electric field, that is, a function of preventing an external electric field (particularly, to prevent static electricity) from effecting the inside (a circuit portion including a transistor). A blocking function of the conductive layer can prevent the variation in electric characteristics of the transistor due to the effect of external electric field such as static electricity.

The transistors 4010 and 4040 included in the respective pixel portions 4002 are each electrically connected to a display element to constitute a display panel. There is no particular limitation on the kind of the display element as long as display can be performed, and various kinds of display elements can be used.

An example of a liquid crystal display device using a liquid crystal element as a display element is illustrated in each of FIG. 7A and FIG. 16A. In each of FIG. 7A and FIG. 16A, a liquid crystal element 4013 which is a display element includes a first electrode layer 4030, a second electrode layer 4031, and a liquid crystal composition 4008. An insulating film 4032 and an insulating film 4033 functioning as orientation films are provided so that the liquid crystal composition 4008 is provided therebetween. The second electrode layer 4031 is provided on the substrate 4006 side, and the first electrode layer 4030 and the second electrode layer 4031 are stacked with the liquid crystal composition 4008 provided therebetween.

A spacer 4035 is a columnar spacer obtained by selective etching of an insulating film and is provided in order to control the thickness of the liquid crystal composition 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal composition 4008. In this case, the liquid crystal composition 4008 is in contact with the first electrode layer 4030 and the second electrode layer 4031. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal composition can be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not necessary and the viewing angle dependence is small. In addition, since an alignment film does not need to be provided and thus rubbing treatment is not necessary, electrostatic discharge damage caused by the rubbing treatment can be prevented and defects and damage of the liquid crystal display device in the manufacturing process can be reduced. Thus, the productivity of the liquid crystal display device can be improved. A transistor including an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device which includes the transistor including an oxide semiconductor film.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. The specific resistivity in this specification is measured at 20° C.

The magnitude of a storage capacitor in the liquid crystal display device is set considering the leakage current of the transistor in the pixel portion or the like so that charge can be held for a predetermined period. The magnitude of the storage capacitor may be set considering the off-state current of the transistor or the like. By using a transistor including an oxide semiconductor film disclosed in this specification, a capacitance that is ⅓ or less, preferably ⅕ or less of liquid crystal capacitance of each pixel is enough as the magnitude of the storage capacitor.

In the transistor including an oxide semiconductor film disclosed in this specification, the current in an off state (off-state current) can be suppressed to be small. Accordingly, an electric signal such as an image signal can be held for a longer period, and a writing interval can be set longer in an on state. The frequency of refresh operation can be accordingly reduced, which leads to an effect of suppressing power consumption.

Further, in the transistor including an oxide semiconductor film disclosed in this specification, relatively high field-effect mobility can be obtained; thus, the transistor can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The disclosed invention is not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. Such a light-emitting element is called a current-excitation light-emitting element owing to such a mechanism. In this embodiment, an example in which an organic EL element is used as the light-emitting element is described.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes have a light-transmitting property. A transistor and the light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

An example of a light-emitting device in which a light-emitting element is used as a display element is illustrated in FIGS. 6A and 6B, FIG. 7B, FIGS. 15A and 15B, and FIG. 16B.

Figure 6A:
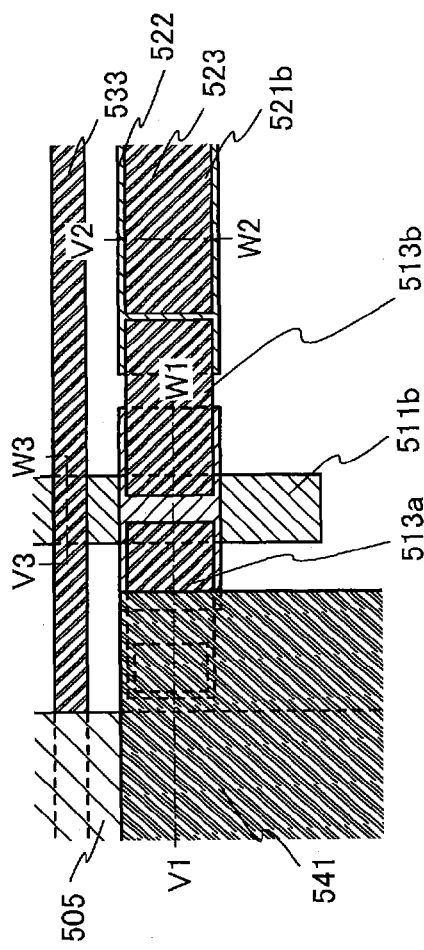
FIGS. 6A and 6B are a plan view and a cross-sectional view illustrating one embodiment of a semiconductor device.
Figure 6B:
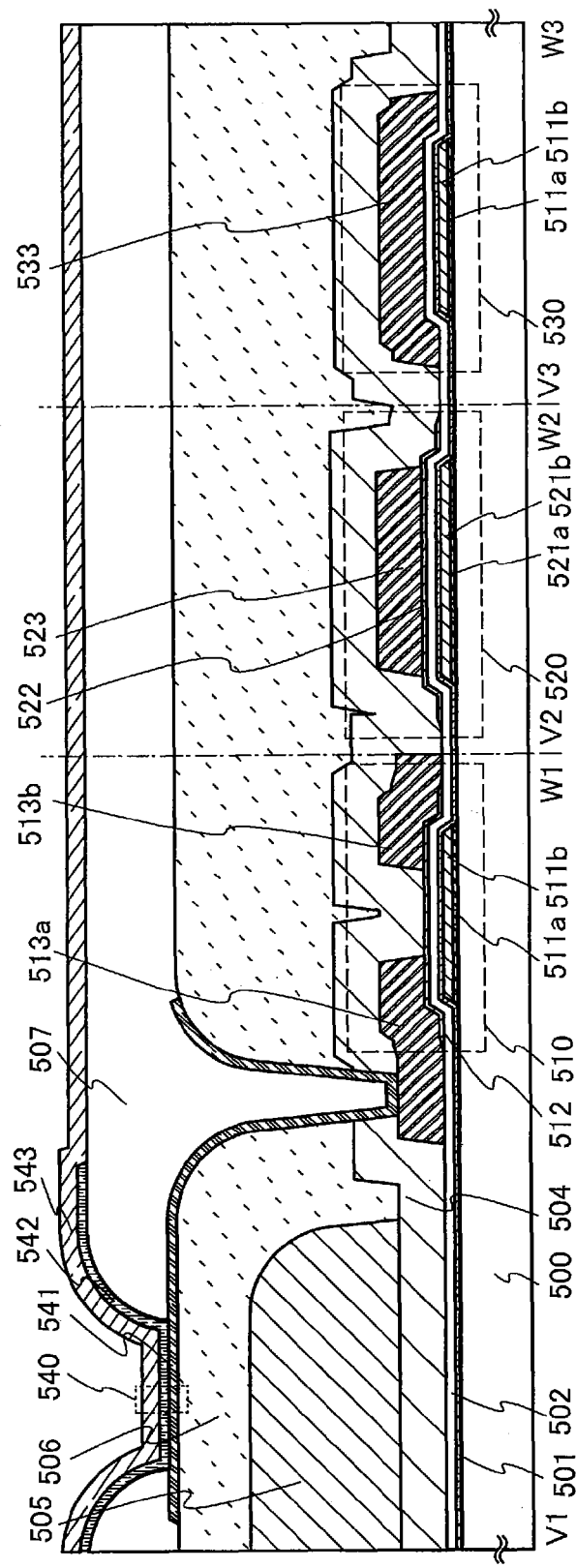

FIG. 6A is a plan view of the light-emitting device, and FIG. 6B is a cross-sectional view taken along the chain lines V1-W1, V2-W2, and V3-W3 in FIG. 6A. Note that in the plan view in FIG. 6A, an electroluminescent layer 542 and a second electrode layer 543 are not illustrated.

The light-emitting device illustrated in FIGS. 6A and 6B includes, over a glass substrate 500, a transistor 510, a capacitor 520, and an intersection 530 of wiring layers. The transistor 510 is electrically connected to a light-emitting element 540. Note that FIGS. 6A and 6B illustrate a bottom-emission light-emitting device in which light from the light-emitting element 540 is extracted through the glass substrate 500.

Any of the transistors described in Embodiments 1 to 6 can be applied to the transistor 510. In this embodiment, an example in which a transistor having a structure similar to that of the transistor 420 described in Embodiment 3 is used is described. The transistor 510 is a staggered transistor having a bottom-gate structure in which an insulating layer functioning as a channel protective film is provided over an oxide semiconductor film.

The transistor 510 includes gate electrode layers 511a and 511b, a first gate insulating film 501, a second gate insulating film 502, an oxide semiconductor film 512, and conductive layers 513a and 513b each functioning as a source electrode layer or a drain electrode layer.

The gate electrode layers of the transistor 510 is covered with a first gate insulating film 501, and the second gate insulating film 502 and the oxide semiconductor film 512 of the transistor 510 are protected from contamination caused by a first metal element contained in the glass substrate 500. Thus, the first metal element contained in the glass substrate 500 has a concentration lower than or equal to $5 \times 10^{18}$ atoms/cm$^3$ (preferably, lower than or equal to $1 \times 10^{18}$ atoms/cm$^3$) at the interface between the first gate insulating film 501 and the second gate insulating film 502.

The first gate insulating film 501 can be formed using a thin nitride insulating film. For example, a silicon nitride film and a silicon nitride oxide film can be given. The thickness of the first gate insulating film 501, which is small, can be made larger than or equal to 30 nm and smaller than or equal to 50 nm. The first gate insulating film 501 may have a single-layer structure or a layered structure. In this embodiment, as the first gate insulating film 501, a silicon nitride film is used.

Consequently, a highly reliable semiconductor device can be provided as a semiconductor device which includes the transistor 510 including the oxide semiconductor film 512 and having stable electric characteristics, which are illustrated in FIGS. 6A and 6B in this embodiment. Further, the highly reliable semiconductor device can be manufactured at high yield, whereby high productivity can be achieved.

The capacitor 520 includes conductive layers 521a and 521b, the second gate insulating film 502, an oxide semiconductor film 522, and a conductive layer 523. The second gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the first gate insulating film 501 and the second gate insulating film 502 provided therebetween. In the structure described in Embodiment 3, not only the second gate insulating film 502 but also the first gate insulating film 501 can be provided between the conductive layer 533 and the gate electrode layers 511a and 511b at the intersection 530 of wiring layers; thus, parasitic capacitance between the conductive layer 533 and the gate electrode layers 511a and 511b can be reduced.

Figure 15A:
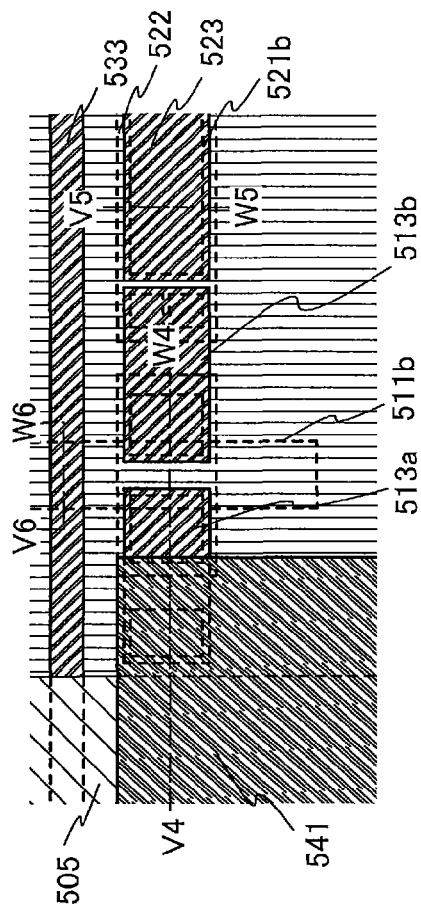
FIGS. 15A and 15B are a plan view and a cross-sectional view illustrating one embodiment of a semiconductor device.
Figure 15B:
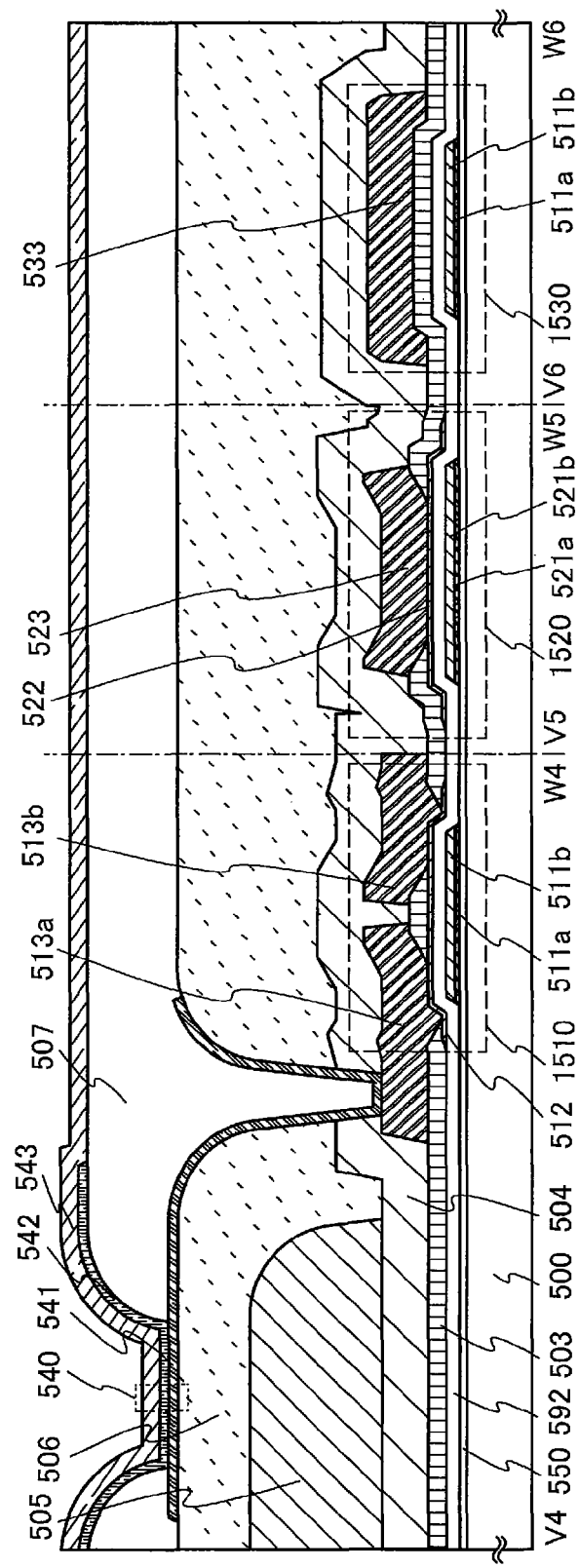

FIG. 15A is a plan view of the light-emitting device, and FIG. 15B is a cross-sectional view taken along the chain lines V4-W4, V5-W5, and V6-W6 in FIG. 15A. Note that in the plan view in FIG. 15A, an electroluminescent layer 542 and a second electrode layer 543 are not illustrated.

The light-emitting device illustrated in FIGS. 15A and 15B includes, over a substrate 500 over which a protective insulating film 550 functioning as a base film is provided, a transistor 1510, a capacitor 1520, and an intersection 1530 of wiring layers. The transistor 1510 is electrically connected to a light-emitting element 540. Note that FIGS. 15A and 15B illustrate a bottom-emission light-emitting device in which light from the light-emitting element 540 is extracted through the glass substrate 500.

The protective insulating film 550 can be formed using a nitride insulating film. For example, a silicon nitride film and a silicon nitride oxide film can be given. Further, the protective insulating film 550 may have a single-layer structure or a layered structure. In this embodiment, as the protective insulating film 550, a silicon nitride film is used.

Any of the transistors described in Embodiments 1 to 6 can be applied to the transistor 1510. In this embodiment, an example in which a transistor having a structure similar to that of the transistor 1420 described in Embodiment 6 is used is described. The transistor 1510 is a staggered transistor having a bottom-gate structure in which an insulating layer functioning as a channel protective film is provided over an oxide semiconductor film.

The transistor 1510 includes the gate electrode layers 511a and 511b, a gate insulating film 592, the oxide semiconductor film 512, the insulating layer 503, and the conductive layers 513a and 513b each functioning as a source electrode layer or a drain electrode layer.

In the transistor 1510, the insulating layer 503 functioning as a channel protective film is provided over a region of the oxide semiconductor film 512 including at least the channel formation region, which overlaps with the gate electrode layers 511a and 511b, and has the opening which reaches the oxide semiconductor film 512 and whose inner wall is covered with the conductive layer 513a or 513b functioning as a source electrode layer or a drain electrode layer.

The transistor 1510 is provided over the glass substrate 500 covered with the protective insulating film 550 and are protected from contamination caused by a second metal element contained in the glass substrate 500. Thus, the second metal element contained in the glass substrate 500 has a concentration lower than or equal to $5 \times 10^{18}$ atoms/cm$^3$ (preferably, lower than or equal to $1 \times 10^{18}$ atoms/cm$^3$) at the interface between the gate insulating film 592 and the gate electrode layers 511a and 511b of the transistor 1510.

Consequently, a highly reliable semiconductor device can be provided as a semiconductor device which includes the transistor 1510 including the oxide semiconductor film 512 and having stable electric characteristics, which are illustrated in FIGS. 15A and 15B in this embodiment. Further, the highly reliable semiconductor device can be manufactured at high yield, whereby high productivity can be achieved.

The capacitor 1520 includes the conductive layers 521a and 521b, the gate insulating film 592, the oxide semiconductor film 522, and the conductive layer 523. The gate insulating film 592 and the oxide semiconductor film 522 are sandwiched between the conductive layer 523 and the conductive layers 521a and 521b, so that the capacitor is formed.

The intersection 1530 of wiring layers is an intersection of the conductive layer 533 and the gate electrode layers 511a and 511b. The conductive layer 533 and the gate electrode layers 511a and 511b intersect with each other with the gate insulating film 592 and the insulating layer 503 provided therebetween. In the structure described in Embodiment 3, not only the gate insulating film 592 but also the insulating layer 503 can be provided between the conductive layer 533 and the gate electrode layers 511a and 511b at the intersection 1530 of wiring layers; thus, parasitic capacitance between the conductive layer 533 and the gate electrode layers 511a and 511b can be reduced.

In this embodiment, a titanium film with a thickness of 30 nm is used as the gate electrode layer 511a and the conductive layer 521a, and a copper thin film with a thickness of 200 nm is used as the gate electrode layer 511b and the conductive layer 521b. Thus, the gate electrode layer has a layered structure of a titanium film and a copper thin film.

An IGZO film with a thickness of 25 nm is used as the oxide semiconductor films 512 and 522.

An interlayer insulating film 504 is formed over each of the transistors 510 and 1510, each of the capacitors 520 and 1520, and each of the intersections 530 and 1530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a layered structure in which a first electrode layer 541, the electroluminescent layer 542, and the second electrode layer 543 are stacked in this order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 or 1510 are electrically connected to each other. Note that a partition 507 is provided so as to cover part of the first electrode layer 541 and the opening.

As the interlayer insulating film 504, a silicon oxynitride film with a thickness larger than or equal to 200 nm and smaller than or equal to 600 nm, which is formed by a plasma-enhanced CVD method can be used. Further, a photosensitive acrylic film with a thickness of 1500 nm and a photosensitive polyimide film with a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a non-photosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the thickness of the color filter layer 505 may be larger than or equal to 1500 nm and smaller than or equal to 2000 nm.

In each of the light-emitting devices illustrated in FIG. 7B and FIG. 16B, a light-emitting element 4513 which is a display element is electrically connected to the transistor 4010 or 4040 provided in the pixel portion 4002. A structure of the light-emitting element 4513 is not limited to the illustrated layered structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 and the partition wall 507 are formed using an organic insulating material or an inorganic insulating material. It is particularly preferable that the partition wall 4510 and the partition wall 507 be formed using a photosensitive resin material to have openings over the first electrode layer 4030 and the first electrode layer 541, respectively, so that a sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition wall 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is formed with the glass substrate 4001, the substrate 4006, and the sealant 4005, a filler 4514 is provided for sealing. It is preferable that the light-emitting element 4513 be packaged (sealed) with a protective film (such as a laminate film or an ultraviolet curable resin film) or a cover material with high air-tightness and little degasification so that the light-emitting element 4513 is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used as the filler.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Further, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 5A to 5C, FIGS. 6A and 6B, FIGS. 7A and 7B, FIGS. 15A and 15B, and FIGS. 16A and 16B, a flexible substrate as well as a glass substrate can be used as the glass substrates 4001 and 500 and the substrate 4006. For example, a light-transmitting plastic substrate or the like can be used. As plastic, a fiberglass-reinforced plastics (FRP) plate, a polyvinyl fluoride (PVF) film, a polyester film, or an acrylic resin film can be used. In the case where the light-transmitting property is not necessary, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma-enhanced CVD method.

The aluminum oxide film which is provided as the insulating film 4020 over the oxide semiconductor film has a high shielding effect (blocking effect) of preventing penetration of both oxygen and impurities such as hydrogen and moisture through the film.

Therefore, in and after the manufacturing process, the aluminum oxide film functions as a protective film for preventing entry of an impurity such as hydrogen or moisture which might cause variation in electric characteristics into the oxide semiconductor film, and release of oxygen which is a main component material of the oxide semiconductor from the oxide semiconductor film.

The insulating films 4021 and 506 each functioning as a planarization insulating film can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. Note that the insulating films may be formed by stacking a plurality of insulating films formed from these materials.

There is no particular limitation on the method of forming the insulating films 4021 and 506, and the following method or tool (equipment) can be used depending on the material: a sputtering method, spin coating, dipping, spray coating, a droplet discharge method (such as an ink-jet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layers 4030 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride of these metals.

In this embodiment, since the light-emitting devices illustrated in FIGS. 6A and 6B and FIGS. 15A and 15B each have a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive film as the second electrode layer 543, a light-reflecting conductive film is preferably stacked therewith.

A conductive composition containing a conductive high molecule (also called a conductive polymer) can be used for the first electrode layers 4030 and 541 and the second electrode layers 4031 and 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

By applying any of the transistors described in Embodiments 1 to 6 as described above, semiconductor devices having a variety of functions can be provided.

The structures, methods, and the like described in this embodiment can be combined as appropriate with any of the structures, methods, and the like described in the other embodiments.

Embodiment 8

A semiconductor device having an image sensor function for reading data of an object can be formed with the use of the transistor described in any of Embodiments 1 to 6.

Figure 8A:
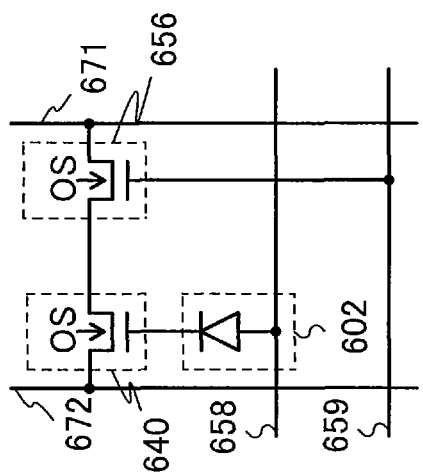
FIGS. 8A and 8B are a circuit diagram and a cross-sectional view of one embodiment of a semiconductor device.
Figure 8B:
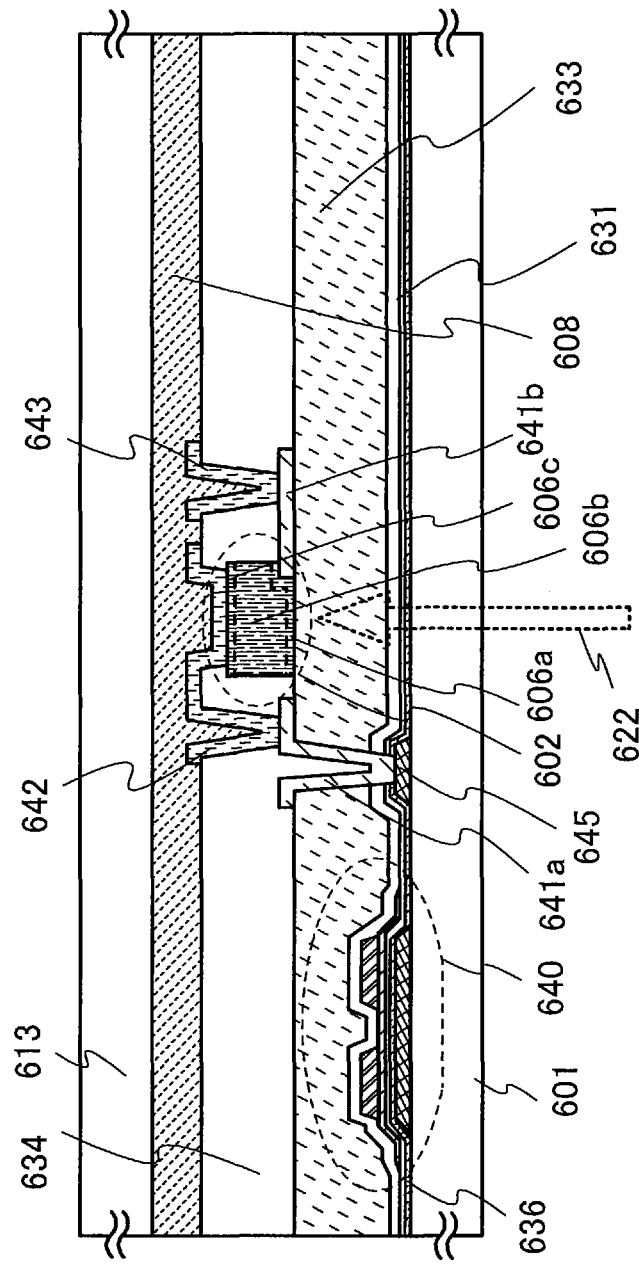
Figure 17A:
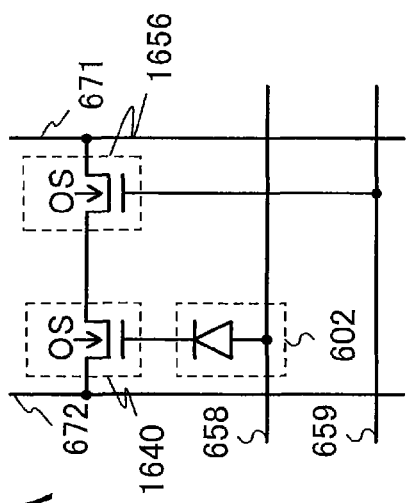
FIGS. 17A and 17B are a circuit diagram and a cross-sectional view of one embodiment of a semiconductor device.
Figure 17B:
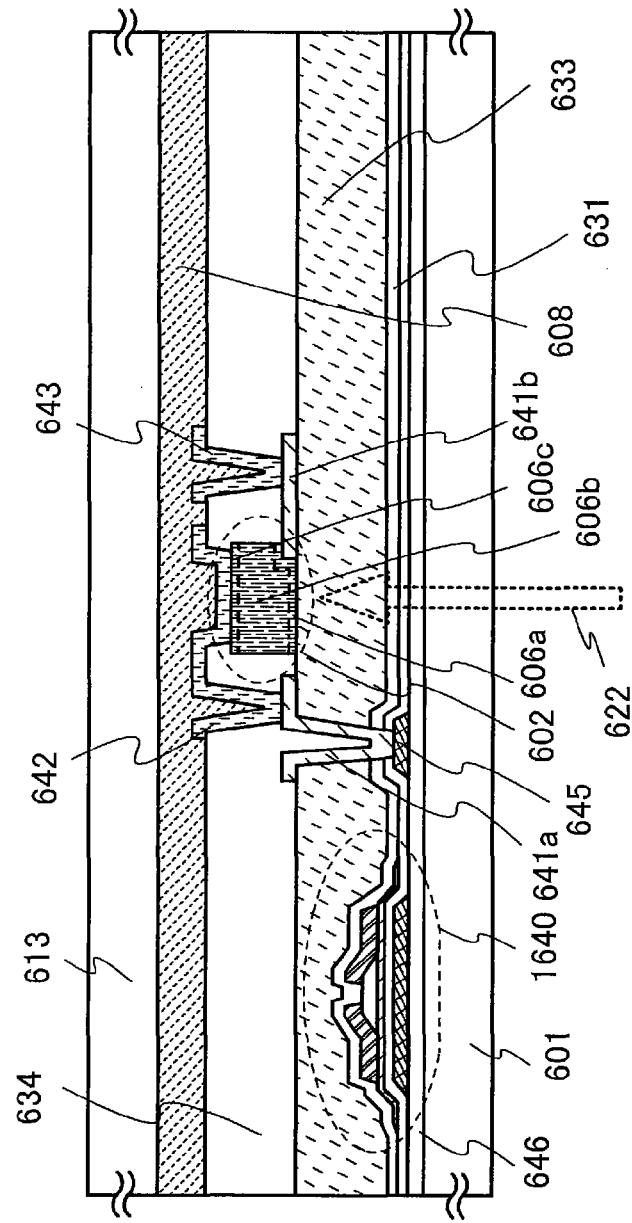

FIGS. 8A and 8B and FIGS. 17A and 17B each illustrate an example of a semiconductor device having an image sensor function. FIG. 8A and FIG. 17A are each an equivalent circuit diagram of a photosensor, and FIG. 8B and FIG. 17B are each a cross-sectional view of part of the photosensor.

One electrode of a photodiode 602 is electrically connected to a photodiode reset signal line 658, and the other electrode of the photodiode 602 is electrically connected to a gate of a transistor 640 or a transistor 1640. One of a source and a drain of the transistor 640 or 1640 is electrically connected to a photosensor reference signal line 672, and the other of the source and the drain thereof is electrically connected to one of a source and a drain of a transistor 656 or a transistor 1656. A gate of the transistor 656 or 1656 is electrically connected to a gate signal line 659, and the other of the source and the drain thereof is electrically connected to a photosensor output signal line 671.

In the circuit diagrams in this specification, a transistor including an oxide semiconductor film is denoted by a symbol "OS" so that it can be clearly identified as a transistor including an oxide semiconductor film. In this embodiment, the transistors 640 and 656 and the transistors 1640 and 1656 are transistors each including an oxide semiconductor film, to which any of the transistors described in Embodiments 1 to 6 can be applied. FIGS. 8A and 8B illustrate an example in which a transistor having a structure similar to that of the transistor 430 described in Embodiment 2 is used, and FIGS. 17A and 17B illustrate an example in which a transistor having a structure similar to that of the transistor 1430 described in Embodiment 5 is used. The transistors 640 and 1640 are each a staggered transistor having a bottom-gate structure in which an insulating layer functioning as a channel protective film is provided over an oxide semiconductor film.

FIG. 8B is a cross-sectional view of the photodiode 602 and the transistor 640 in the photosensor. The transistor 640 and the photodiode 602 functioning as a sensor are provided over a glass substrate 601. A substrate 613 is provided over the photodiode 602 and the transistor 640 with the use of an adhesive layer 608.

A first gate insulating film 636 covers a gate electrode layer of the transistor 640 and can be formed using a thin nitride insulating film. For example, a silicon nitride film and a silicon nitride oxide film can be given. The thickness of the first gate insulating film 636, which is small, can be made larger than or equal to 30 nm and smaller than or equal to 50 nm. The first gate insulating film 636 may have a single-layer structure or a layered structure. In this embodiment, as the first gate insulating film 636, a silicon nitride film is used.

FIG. 17B is a cross-sectional view of the photodiode 602 and the transistor 1640 in the photosensor. The transistor 1640 and the photodiode 602 functioning as a sensor are provided over a glass substrate 601 over which a protective insulating film 646 is provided. A substrate 613 is provided over the photodiode 602 and the transistor 1640 with the use of an adhesive layer 608.

The protective insulating film 646 can be formed using a nitride insulating film. For example, a silicon nitride film and a silicon nitride oxide film can be given. The protective insulating film 646 may have a single-layer structure or a layered structure. In this embodiment, as the protective insulating film 646, a silicon nitride film is used.

An insulating film 631, an interlayer insulating film 633, and an interlayer insulating film 634 are provided over the transistor 640 or 1640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between electrode layers 641a and 641b formed over the interlayer insulating film 633 and an electrode layer 642 formed over the interlayer insulating film 634.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to the gate electrode layer of the transistor 640 or 1640, and the photodiode 602 is electrically connected to the transistor 640 or 1640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma-enhanced CVD method with the use of a semiconductor source gas containing an impurity element belonging to Group 13 (e.g., boron (B)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as a method of forming the amorphous silicon film, an LPCVD method, a vapor deposition method, a sputtering method, or the like is used. The first semiconductor film 606a is preferably formed with a thickness larger than or equal to 10 nm and smaller than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma-enhanced CVD method with the use of a semiconductor source gas. As the semiconductor source gas, silane ($SiH_4$) can be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed with a thickness larger than or equal to 200 nm and smaller than or equal to 1000 nm.

The third semiconductor film 606c is an n-type semiconductor film and is formed using an amorphous silicon film containing an impurity element imparting n-type conductivity. The third semiconductor film 606c is formed by a plasma-enhanced CVD method with the use of a semiconductor source gas containing an impurity element belonging to Group 15 (e.g., phosphorus (P)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as the method of forming the amorphous silicon film, an LPCVD method, a vapor deposition method, a sputtering method, or the like is used. The third semiconductor film 606c is preferably formed with a thickness larger than or equal to 20 nm and smaller than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the glass substrate 601, over which the pin photodiode is formed, is converted into electric signals is described. Further, light from the semiconductor film having the conductivity type opposite to that of the semiconductor film on the light-receiving plane is disturbance light; therefore, the electrode layer is formed using a light-blocking conductive film. A surface on the n-type semiconductor film side can alternatively be used as the light-receiving plane.

With the use of an insulating material, the insulating film 631, the interlayer insulating film 633, and the interlayer insulating film 634 can be formed using the following method or tool (equipment) depending on the material: a sputtering method, a plasma-enhanced CVD method, spin coating, dipping, spray coating, a droplet discharge method (such as an ink-jet method), or a printing method (such as screen printing or offset printing).

The insulating film 631 can be formed using an inorganic insulating material and can have a single-layer structure or a layered structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma-enhanced CVD method.

The aluminum oxide film which is provided as the insulating film 631 over the oxide semiconductor film has a high shielding effect (blocking effect) of preventing penetration of both oxygen and impurities such as hydrogen and moisture through the film.

Therefore, in and after the manufacturing process, the aluminum oxide film functions as a protective film for preventing entry of an impurity such as hydrogen or moisture which might cause variation in electric characteristics into the oxide semiconductor film, and release of oxygen which is a main component material of the oxide semiconductor from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as a polyimide resin, an acrylic resin, a benzocyclobutene-based resin, a polyamide resin, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, data on an object to be detected can be read. A light source such as a backlight can be used at the time of reading data on the object to be detected.

The gate electrode layer of the transistor 640 is covered with the first gate insulating film 636, and a second gate insulating film and an oxide semiconductor film of the transistor 640 are protected from contamination caused by a first metal element contained in the glass substrate 601. Thus, the first metal element contained in the glass substrate 601 has a concentration lower than or equal to $5 \times 10^{18}$ atoms/cm$^3$ (preferably, lower than or equal to $1 \times 10^{18}$ atoms/cm$^3$) at the interface between the first gate insulating film 636 and the second gate insulating film.

The transistor 1640 is provided over the glass substrate 601 covered with the protective insulating film 646 and are protected from contamination caused by a second metal element contained in the glass substrate 601. Thus, the second metal element contained in the glass substrate 601 has a concentration lower than or equal to $5 \times 10^{18}$ atoms/cm$^3$ (preferably, lower than or equal to $1 \times 10^{18}$ atoms/cm$^3$) at the interface between a gate insulating film and a gate electrode layer of the transistors 1640.

Consequently, a highly reliable semiconductor device which includes the transistor 640 or 1640 including the oxide semiconductor film and having stable electric characteristics, which is described in this embodiment, can be provided. Further, the highly reliable semiconductor device can be manufactured at high yield, whereby high productivity can be achieved.

The structures, methods, and the like described in this embodiment can be combined as appropriate with any of the structures, methods, and the like described in the other embodiments.

Embodiment 9

A semiconductor device disclosed in this specification can be applied to a variety of electronic devices (including game machines). Examples of electronic devices include a television set (also referred to as a television or a television receiver), a monitor of a computer, cameras such as a digital camera and a digital video camera, a digital photo frame, a mobile phone, a portable game machine, a portable information terminal, an audio reproducing device, a game machine (e.g., a pachinko machine or a slot machine), and a game console. Specific examples of these electronic devices are illustrated in FIGS. 9A to 9C.

Figure 9A:
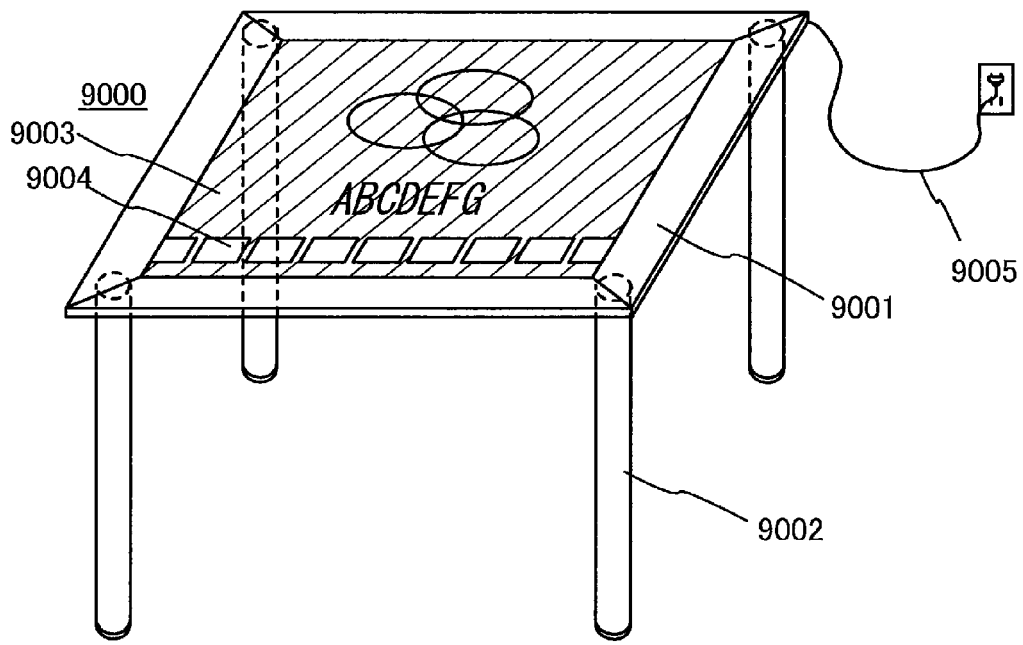
FIGS. 9A to 9C each illustrate an electronic device.
Figure 9B:
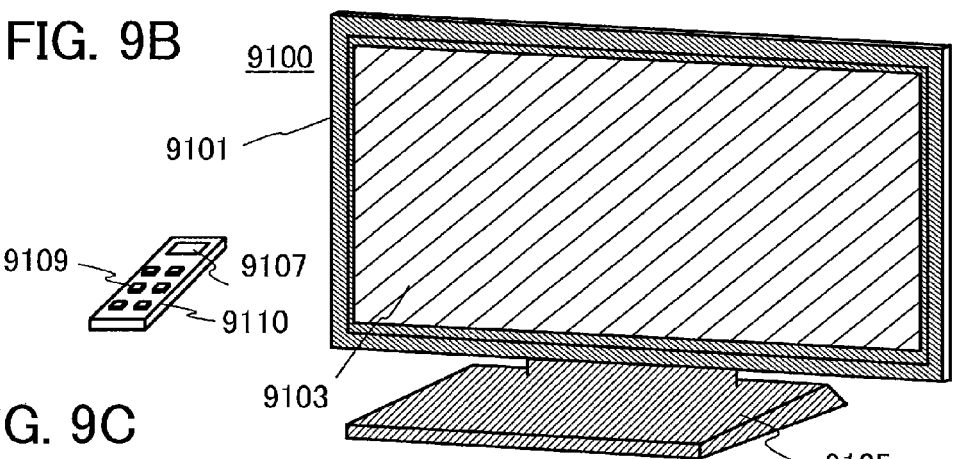
Figure 9C:
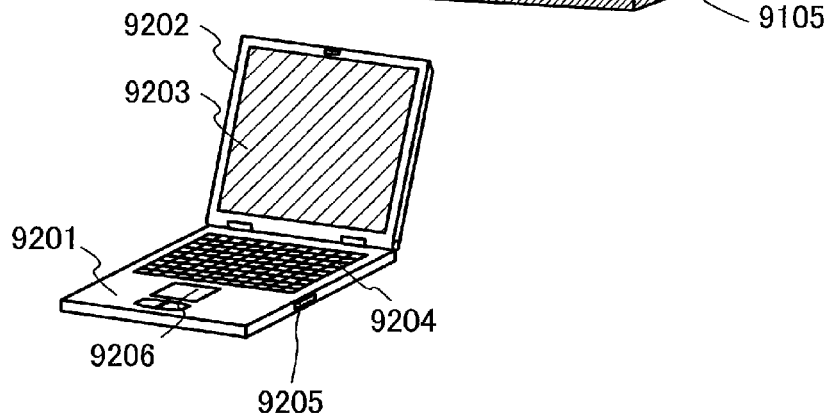

FIG. 9A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 8 can be used for the display portion 9003 so that the table 9000 having the display portion can have a high reliability.

The display portion 9003 has a touch-input function. When users touch displayed buttons 9004 which are displayed on the display portion 9003 of the table 9000 with their fingers or the like, the users can carry out operation of the screen and input of data. Further, when the table may be made to communicate with home appliances or control the home appliances, the display portion 9003 may function as a control device which controls the home appliances by operation on the screen. For example, with the use of the semiconductor device having an image sensor function described in Embodiment 8, the display portion 9003 can have a touch-input function.

Further, the screen of the display portion 9003 can be placed perpendicular to a floor with a hinge provided for the housing 9001; thus, the table 9000 can also be used as a television set. When a television device having a large screen is set in a small room, an open space is reduced; however, when a display portion is incorporated in the table, a space in the room can be efficiently used.

FIG. 9B illustrates a television set 9100. In the television set 9100, a display portion 9103 is incorporated in a housing 9101 and an image can be displayed on the display portion 9103. Note that here the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 9B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

The semiconductor device described in any of Embodiments 1 to 8 can be used for the display portions 9103 and 9107 so that the television set and the remote controller can have a high reliability.

FIG. 9C illustrates a computer, which includes a main body 9201, a housing 9202, a display portion 9203, a keyboard 9204, an external connection port 9205, a pointing device 9206, and the like.

The semiconductor device described in any of Embodiments 1 to 8 can be used for the display portion 9203 so that the computer can have a high reliability.

Figure 10A:
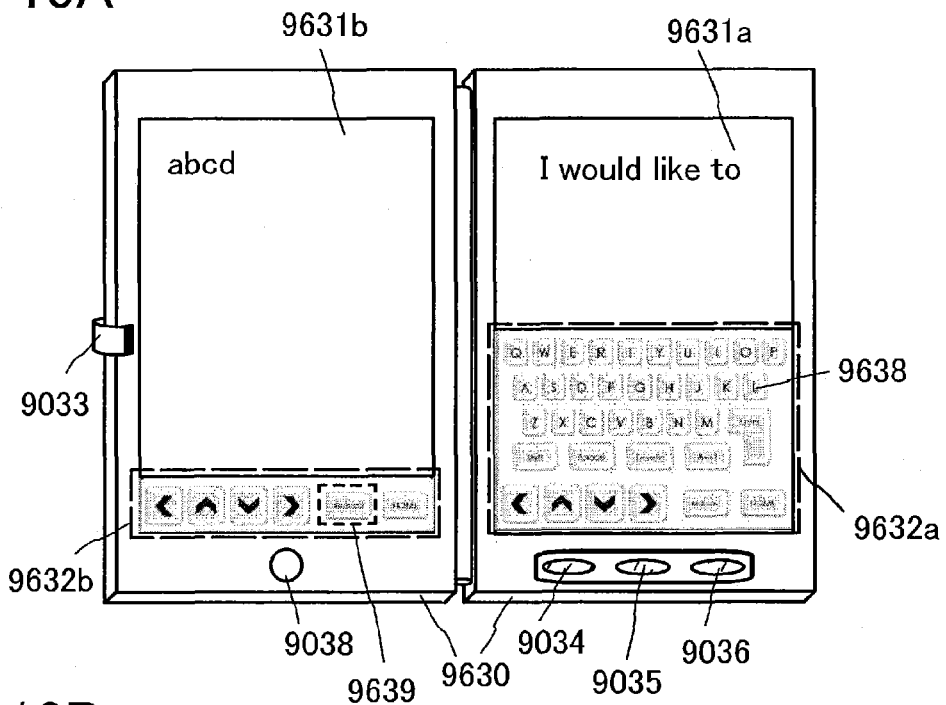
FIGS. 10A to 10C each illustrate an electronic device.
Figure 10B:
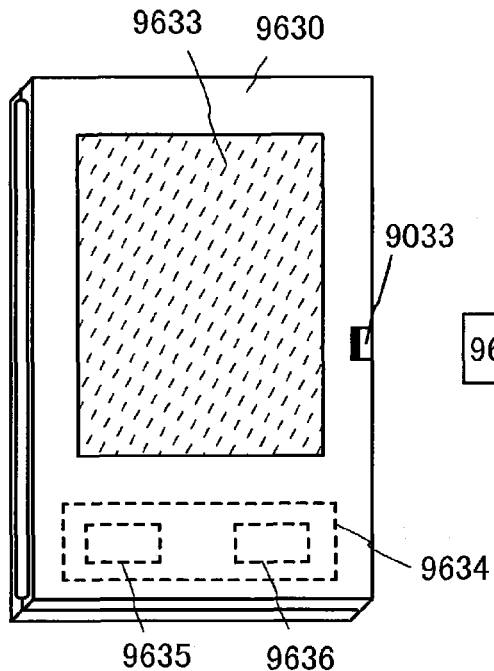

FIGS. 10A and 10B illustrate an example of a foldable tablet. FIG. 10A illustrates the tablet which is unfolded. The tablet includes a housing 9630, a display portion 9631a, a display portion 9631b, a display mode switch 9034, a power switch 9035, a power-saving mode switch 9036, a clasp 9033, and an operation switch 9038.

The semiconductor device described in any of Embodiments 1 to 8 can be used for the display portions 9631a and 9631b so that the tablet terminal can have a high reliability.

Part of the display portion 9631a can be a touch panel region 9632a, and data can be input by touching operation keys 9638 that are displayed. Although a structure in which a half region in the display portion 9631a has only a display function and the other half region has a touch panel function is shown as an example, the display portion 9631a is not limited to this structure. The whole region in the display portion 9631a may have a touch panel function. For example, the display portion 9631a can display keyboard buttons in the whole region to be a touch panel, and the display portion 9631b can be used as a display screen.

In a manner similar to that of the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The switch 9034 for switching display modes can switch the display between a portrait mode and a landscape mode, and between monochrome display and color display, for example. The switch 9036 for switching to power-saving mode can control display luminance to be optimal in accordance with the amount of external light in use of the tablet terminal which is detected by an optical sensor incorporated in the tablet terminal. Another detection device including a sensor for detecting inclination, such as a gyroscope or an acceleration sensor, may be incorporated in the tablet terminal, in addition to the optical sensor.

Although the display portion 9631a and the display portion 9631b have the same display area in FIG. 10A, one embodiment of the present invention is not particularly limited to this example. The display portion 9631a and the display portion 9631b may have different areas or different display quality. For example, higher definition images may be displayed on one of the display portions 9631a and 9631b.

FIG. 10B illustrates the tablet terminal which is folded, which includes the housing 9630, a solar battery 9633, a charge and discharge control circuit 9634, a battery 9635, and a DC-DC converter 9636. As an example, FIG. 10B illustrates the charge and discharge control circuit 9634 including the battery 9635 and the DC-DC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 10A and 10B can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

The solar battery 9633, which is attached on a surface of the tablet terminal, can supply electric power to a touch panel, a display portion, an image signal processor, and the like. Note that the solar battery 9633 can be provided on one or two surfaces of the housing 9630, so that the battery 9635 can be charged efficiently. The use of a lithium ion battery as the battery 9635 is advantageous in downsizing or the like.

Figure 10C:
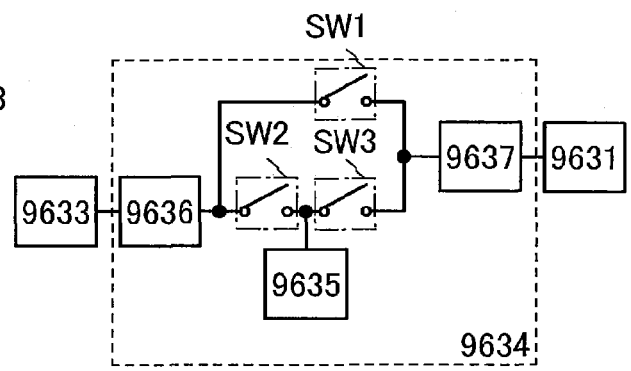

The structure and operation of the charge and discharge control circuit 9634 illustrated in FIG. 10B will be described with reference to a block diagram in FIG. 10C. FIG. 10C illustrates the solar battery 9633, the battery 9635, the DC-DC converter 9636, a converter 9637, switches SW1 to SW3, and a display portion 9631. The battery 9635, the DC-DC converter 9636, the converter 9637, and the switches SW1 to SW3 correspond to the charge and discharge control circuit 9634 illustrated in FIG. 10B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion

9631. In addition, when display on the display portion 9631 is not performed, the switch SW1 is turned off and the switch SW2 is turned on so that charge of the battery 9635 may be performed.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

The structures, methods, and the like described in this embodiment can be combined as appropriate with any of the structures, methods, and the like described in the other embodiments.

This application is based on Japanese Patent Application serial No. 2011-233187 filed with the Japan Patent Office on Oct. 24, 2011 and Japanese Patent Application serial No. 2011-233278 filed with the Japan Patent Office on Oct. 24, 2011, the entire contents of which are hereby incorporated by reference.

What is claimed is:

1. A semiconductor device comprising:
   a gate electrode layer over a glass substrate comprising one or more metal elements;
   a first gate insulating film over the gate electrode layer;
   a second gate insulating film over and in contact with the first gate insulating film;
   an oxide semiconductor film over the second gate insulating film; and
   a source electrode layer and a drain electrode layer over the oxide semiconductor film,
   wherein a composition of the first gate insulating film is different from a composition of the second gate insulating film, and
   wherein, at an interface between the first gate insulating film and the second gate insulating film, a concentration of the one or more metal elements diffused from the glass substrate is lower than or equal to $5\times10^{18}$ atoms/cm$^3$.

2. The semiconductor device according to claim 1, further comprising an insulating layer over and in contact with the oxide semiconductor film,
   wherein the source electrode layer and the drain electrode layer are formed over the oxide semiconductor film and the insulating layer.

3. The semiconductor device according to claim 1, wherein the first gate insulating film is a nitride insulating film.

4. The semiconductor device according to claim 1, wherein the first gate insulating film is a silicon nitride film or a silicon nitride oxide film.

5. The semiconductor device according to claim 1, wherein the one or more metal elements are selected from sodium, aluminum, magnesium, calcium, strontium, and barium.

6. The semiconductor device according to claim 1, wherein the second gate insulating film is selected from a silicon oxide film, a gallium oxide film, an aluminum oxide film, a silicon nitride film, a silicon oxynitride film, an aluminum oxynitride film, a silicon nitride oxide film, a hafnium oxide film, a yttrium oxide film, a hafnium silicate film, a hafnium silicate film comprising nitrogen, a hafnium aluminate film, and a lanthanum oxide film.

7. A semiconductor device comprising:
   a protective insulating film over a glass substrate comprising one or more metal elements;

a gate electrode layer over the protective insulating film;
a gate insulating film over the gate electrode layer;
an oxide semiconductor film over the gate insulating film; and
a source electrode layer and a drain electrode layer over the oxide semiconductor film,
wherein a composition of the protective insulating film is different from a composition of the gate insulating film, and
wherein, at an interface between the gate electrode layer and the gate insulating film, a concentration of the one or more metal elements diffused from the glass substrate is lower than or equal to $5\times10^{18}$ atoms/cm$^3$.

8. The semiconductor device according to claim 7, further comprising an insulating layer over and in contact with the oxide semiconductor film,
wherein the source electrode layer and the drain electrode layer are formed over the oxide semiconductor film and the insulating layer.

9. The semiconductor device according to claim 7, wherein the protective insulating film is a nitride insulating film.

10. The semiconductor device according to claim 7, wherein the protective insulating film is a silicon nitride film or a silicon nitride oxide film.

11. The semiconductor device according to claim 7, wherein the one or more metal elements are selected from sodium, aluminum, magnesium, calcium, strontium, and barium.

12. The semiconductor device according to claim 7, wherein the gate insulating film is selected from a silicon oxide film, a gallium oxide film, an aluminum oxide film, a silicon nitride film, a silicon oxynitride film, an aluminum oxynitride film, a silicon nitride oxide film, a hafnium oxide film, a yttrium oxide film, a hafnium silicate film, a hafnium silicate film comprising nitrogen, a hafnium aluminate film, and a lanthanum oxide film.

13. A semiconductor device comprising:
a gate electrode layer;
a first gate insulating film over the gate electrode layer;
a second gate insulating film over and in contact with the first gate insulating film;
an oxide semiconductor film over the second gate insulating film; and
a source electrode layer and a drain electrode layer over the oxide semiconductor film,
wherein a composition of the first gate insulating film is different from a composition of the second gate insulating film,
wherein the second gate insulating film contains oxygen at a proportion higher than a proportion of oxygen in a stoichiometric composition of an insulating material which is included in the second gate insulating film, and
wherein, at an interface between the first gate insulating film and the second gate insulating film, a concentration of one or more metal elements is lower than or equal to $5\times10^{18}$ atoms/cm$^3$.

14. The semiconductor device according to claim 13, wherein the first gate insulating film is a nitride insulating film.

15. The semiconductor device according to claim 13, wherein the first gate insulating film comprises aluminum oxide.

16. The semiconductor device according to claim 13, wherein the insulating material is represented by a formula of $SiO_{2+\alpha}$, and wherein a is larger than 0.

* * * * *

UNITED STATES PATENT AND TRADEMARK OFFICE
CERTIFICATE OF CORRECTION

PATENT NO. : 8,937,305 B2
APPLICATION NO. : 13/652686
DATED : January 20, 2015
INVENTOR(S) : Takayuki Cho et al.

It is certified that error appears in the above-identified patent and that said Letters Patent is hereby corrected as shown below:

In the Specification

At column 10, line 4, "$InO_x$," should be --$InO_x$--;

At column 10, line 5, "$ZnO_z$," should be --$ZnO_z$--;

In the Claims

In claim 16, at column 56, line 32, "a is" should be --$\alpha$ is--.

Signed and Sealed this
Ninth Day of June, 2015

Michelle K. Lee
*Director of the United States Patent and Trademark Office*